US 6,602,764 B2

(12) United States Patent
Linthicum et al.

(10) Patent No.: US 6,602,764 B2
(45) Date of Patent: *Aug. 5, 2003

(54) METHODS OF FABRICATING GALLIUM NITRIDE MICROELECTRONIC LAYERS ON SILICON LAYERS

(75) Inventors: Kevin J. Linthicum, Angier, NC (US); Thomas Gehrke, Carrboro, NC (US); Robert F. Davis, Raleigh, NC (US); Darren B. Thomson, Cary, NC (US); Kieran M. Tracy, Raliegh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/850,687

(22) Filed: May 7, 2001

(65) Prior Publication Data

US 2002/0031851 A1 Mar. 14, 2002

Related U.S. Application Data

(63) Continuation of application No. 09/441,754, filed on Nov. 17, 1999, now Pat. No. 6,255,198.
(60) Provisional application No. 60/109,860, filed on Nov. 24, 1998, and provisional application No. 60/109,674, filed on Nov. 24, 1998.

(51) Int. Cl.$^7$ .......................... H01L 21/20; H01L 33/00
(52) U.S. Cl. ........................................ 438/481; 257/103
(58) Field of Search ..................... 438/46, 478, 481, 438/503, 507, 605, 606, 607, 603, 674, 480; 257/76, 94, 96, 103

(56) References Cited

U.S. PATENT DOCUMENTS 4,127,792 A   11/1978 Nakata ..................... 313/500
4,522,661 A   6/1985 Morrison et al. .......... 148/33.2

(List continued on next page.)

FOREIGN PATENT DOCUMENTS

CA    2258080       10/1998
EP    0 551 721 A2  7/1993

(List continued on next page.)

OTHER PUBLICATIONS

International Search Report, PCT/US99/04346, Jun. 9, 1999.
International Search Report, PCT/US99/28056, Apr. 26, 2000.
International Search Report, PCT/US99/27358, Apr. 28, 2000.
International Search Report, PCT/US99/12967, Oct. 18, 1999.

(List continued on next page.)

*Primary Examiner*—Olik Chaudhuri
*Assistant Examiner*—Brook Kebede
(74) *Attorney, Agent, or Firm*—Moore & Van Allen PLLC; Steven B. Phillips

(57) ABSTRACT

A gallium nitride microelectronic layer is fabricated by converting a surface of a (111) silicon layer to 3C-silicon carbide. A layer of 3C-silicon carbide is then epitaxially grown on the converted surface of the (111) silicon layer. A layer of 2H-gallium nitride then is grown on the epitaxially grown layer of 3C-silicon carbide. The layer of 2H-gallium nitride then is laterally grown to produce the gallium nitride microelectronic layer. The silicon layer is a (111) silicon substrate, the surface of which is converted to 3C-silicon carbide, or the (111) silicon layer is part of a Separation by IMplanted OXygen (SIMOX) silicon substrate which includes a layer of implanted oxygen that defines the (111) layer on the (111) silicon substrate, or the (111) silicon layer is a portion of a Silicon-On-Insulator (SOI) substrate in which a (111) silicon layer is bonded to a substrate.

26 Claims, 20 Drawing Sheets

U.S. PATENT DOCUMENTS

| | | | |
|---|---|---|---|
| 4,651,407 A | | 3/1987 | Bencuya ..................... 29/571 |
| 4,865,685 A | * | 9/1989 | Palmour ................ 204/192.37 |
| 4,876,210 A | | 10/1989 | Barnett et al. ................. 437/5 |
| 4,912,064 A | * | 3/1990 | Kong et al. ................. 117/101 |
| 4,946,547 A | * | 8/1990 | Palmour et al. ............ 117/101 |
| 5,122,845 A | | 6/1992 | Manabe et al. ............... 357/17 |
| 5,156,995 A | | 10/1992 | Fitzgerald, Jr. et al. ....... 437/90 |
| RE34,861 E | | 2/1995 | Davis et al. ................. 437/100 |
| 5,389,571 A | | 2/1995 | Takeuchi et al. ............ 437/133 |
| 5,397,736 A | | 3/1995 | Bauser et al. ................. 437/92 |
| 5,549,747 A | | 8/1996 | Bozler et al. ................. 117/43 |
| 5,710,057 A | | 1/1998 | Kenney ....................... 437/62 |
| 5,760,426 A | | 6/1998 | Marx et al. ................. 257/190 |
| 5,786,606 A | * | 7/1998 | Nishio et al. ............... 257/106 |
| 5,815,520 A | | 9/1998 | Furushima .................. 372/45 |
| 5,877,070 A | | 3/1999 | Goesele et al. ............. 438/458 |
| 5,880,485 A | | 3/1999 | Marx et al. .................. 257/94 |
| 5,912,477 A | | 6/1999 | Negley ........................ 257/95 |
| 5,915,194 A | * | 6/1999 | Powell et al. ............... 438/478 |
| 6,051,849 A | * | 4/2000 | Davis et al. ................ 257/103 |
| 6,100,104 A | | 8/2000 | Haerle ........................ 438/63 |
| 6,100,111 A | | 8/2000 | Konstantinov ............... 438/92 |
| 6,153,010 A | | 11/2000 | Kiyoku et al. ............... 117/95 |
| 6,255,198 B1 | * | 7/2001 | Linthicum et al. .......... 257/103 |

FOREIGN PATENT DOCUMENTS

| | | |
|---|---|---|
| EP | 0 852 416 A1 | 7/1998 |
| EP | 0 942 459 A1 | 9/1999 |
| EP | 0 951 055 A2 | 10/1999 |
| JP | 3-132016 | 6/1991 |
| JP | 4-188678 | 7/1992 |
| JP | 5-7016 | 1/1993 |
| JP | 5-41536 | 2/1993 |
| JP | 8-18159 | 1/1996 |
| JP | 08-064791 | 3/1996 |
| JP | 8-116093 | 5/1996 |
| JP | 8-125251 | 5/1996 |
| JP | 8-153931 | 6/1996 |
| JP | 9-93315 | 4/1997 |
| JP | 9-174494 | 6/1997 |
| JP | 9-181071 | 7/1997 |
| JP | 9-201477 | 7/1997 |
| JP | 9-277448 | 10/1997 |
| JP | 9-290098 | 10/1997 |
| JP | 9-324997 | 11/1997 |
| JP | 11-145516 | 5/1999 |
| WO | WO 97/11518 | 3/1997 |
| WO | WO 98/47170 | 10/1998 |

OTHER PUBLICATIONS

Honda et al., Selective Area Growth of GaN Microstructures on Patterned (111) and (001) Si Substrates, 4$^{th}$ European Workshop on GaN, Nottingham, UK, Jul. 2–5, 2000.

Gehrke et al., Pendeo–Epitaxial Growth of Gallium Nitride on Silicon Substrates, Journal of Electronic Materials, vol. 29, No. 3, Mar. 2000, pp. 306–310.

Leo Unmasked by Pendeo–Epitaxy, Compound Semiconductor, Mar. 1999, p 16.

Gehrke et al., Pendeo–Epitaxy of Gallium Nitride and Aluminum Nitride Films and Heterostructures on Silicon Carbide Substrate, MRS Internet J. Semicond. Res. 4S1, G3.2, 1999, 6 pp.

Thomson et al., Ranges of Deposition Temperatures Applicable for Metalorganic Vapor Phase Epitaxy of GaN Films Via the Technique of Pendeo–Epitaxy, MRS Internet J. Semicond. Res. 4S1, G3.37, 1999, 6 pp.

Gallium Nitride–2000–Technology, Status, Applications, and Market Forecasts, Strategies Unlimited, Report SC–23, May 2000.

Chen et al., Dislocation Reducing in GaN Thin Films Via Lateral Overgrowth From Trenches, Applied Physics Letters, vol. 75, No. 14, Oct. 4, 1999, pp. 2062–2063.

Nakamura, InGaN/GaN/AlGaN–Based Laser Diodes, Properties, Processing and Applications of Gallium Nitride and Related Semiconductors, EMIS Datareviews Series No. 23, 1998, pp. 587–595.

Hiramatsu et al., Selective Area Growth and Epitaxial Lateral Overgrowth of GaN, Properties, Processing and Applications of Gallium Nitride and Related Semiconductors, EMIS Datareviews Series No. 23, 1998, pp. 440–446.

Sakai, Defect Structure in Selectively Grown GaN Films With Low Threading Dislocation Density, Appl. Phys. Lett., vol. 71, No. 16, Oct. 20, 1997, pp. 2259–2261.

Gustafsson et al., Investigations of High Quality $Ge_xSi_{1-x}$ Grown by Heteroepitaxial Lateral Overgrowth Using Cathoduluminescence, Inst. Phys. Conf. Ser. No. 134: Section 11, Micros. Semicond. Mater. Conf., Oxford, Apr. 5–8, 1993, pp. 675–678.

Givargizov, Other Approaches to Oriented Crystallization on Amorphous Substrates, Chapter 4, Oriented Crystallization on Amorphous Substrates, Plenum Press, 1991, pp. 221–264.

Akasaki et al., Effects of AlN Buffer Layer on Crystallographic Structure and on Electrical and Optical Properties of GaN and $Ga_{1-x}Al_xN$ ($0<x\leq 0.4$) Films Grown on Sapphire Substrate by MOVPE, Journal of Crystal Growth, vol. 98, 1989, pp. 209–219.

Ujiie et al., Epitaxial Lateral Overgrowth of GaAs on a Si Substrate, Jpn. J. Appl. Phys., vol. 28, 1989, p. L337–L339.

Ishiwara et al., Lateral Solid Phase Epitaxy of Amorphous Si Films on Si Substrates With $SiO_2$ Patterns, Applied Physics Letters, vol. 43, No. 11, Dec. 1, 1983, pp. 1028–1030.

Jastrzebski, SOI by CVD: Epitaxial Lateral Overgrowth (ELO) Process–Review, Journal of Crystal Growth, vol. 63, 1983, pp. 493–526.

Rathman et al., Lateral Epitaxial Overgrowth of Silicon on $SiO_2$, Journal of Electrochemical Society, Oct. 1982, pp. 2303–2306.

Shaw, Selective Epitaxial Deposition of Gallium Arsenide in Holes, Journal of the Electrochemical Society, Sep. 1966, pp. 904–908.

Tausch, Jr. et al., A Novel Crystal Growth Phenomenon: Single Crystal GaAs Overgrowth Onto Silicon Dioxide, Journal of the Electrochemical Society, Jul. 1965, pp. 706–709.

Joyce et al., Selective Epitaxial Deposition of Silicon, Nature, vol. 4840, Aug. 4, 1962, pp. 485–486.

Linthicum et al., Pendeoepitaxy of Gallium Nitride Thin Films, Applied Physics Letters, vol. 75, No. 2, Jul. 12, 1999, pp. 196–198.

Nakamura, InGaN–Based Violet Laser Diodes, Semicond. Sci. Technol., 14, 1999, pp. R27–R40.

Nakamura et al., Violet InGaN/GaN/AlGaN–Based Laser Diodes Operable at 50°C With a Fundamental Transverse Mode, Jpn. J. Appl. Phys. vol. 38, Part 1, No. 3A, Mar. 1, 1999, pp. L226–L229.

Zheleva et al., Pendeo–Epitaxy: A New Approach for Lateral Growth of Gallium Nitride Films, Journal of Electronic Materials, vol. 28, No. 4, Feb. 1999, pp. L5–L8.

Boo et al., Growth of Hexagonal GaN Thin Films on Si(111) with Cubic SiC Buffer Layers, Journal of Crystal Growth 189–190, 1998, pp. 183–188.

Linthicum et al., Process Routes for Low–Defect Density GaN on Various Substrates Employing Pendeo–Epitaxial Growth Techniques, MRS Internet Journal of Nitride Semiconductor Research, Fall Meeting of the Materials Research Society, vol. 4S1, No. G4.9, Nov. 30, 1998–Dec. 4, 1998.

Nakamura et al., InGaN/GaN/AlGaN–Based Laser Diodes Grown on GaN Substrates With a Fundamental Transverse Mode, Jpn. J. Appl. Phys., vol. 37, Sep. 15, 1998, pp. L1020–L1022.

Marchand et al., Microstructure of GaN Laterally Overgrown by Metalorganic Chemical Vapor Deposition, Applied Physics Letters, vol. 73, No. 6, Aug. 10, 1998, pp. 747–749.

Sakai et al., Transmission Electron Microscopy of Defects in GaN Films Formed by Epitaxial Lateral Overgrowth, vol. 73, No. 4, Jul. 27, 1998, pp. 481–483.

Nakamura et al., High–Power, Long–Lifetime InGaN/GaN/AlGaN–Based Laser Diodes Grown on Pure GaN Substrates, Jpn. J. Appl. Phys., vol. 37, Mar. 15, 1998, pp. L309–L312.

Nam et al., Lateral Epitaxial Overgrowth of GaN Films on $SiO_2$ Areas Via Metalorganic Vapor Phase Epitaxy, Journal of Electronic Materials, vol. 27, No. 4, 1998, pp. 233–237.

Wu et al., Growth and Characterization of SiC Films on Large–Area Si Wafers by APCVD–Temperature Dependence, Materials Science Forum, vols. 264–268, 1998, pp. 179–182.

Nakamura et al., InGaN/GaN/AlGaN–Based Laser Diodes With Modulation–Doped Strained–Layer Superlattices, Jpn. J. Appl. Phys., vol. 36, Dec. 1, 1997, pp. L1568–L1571.

Kapolnek et al., "Anisotropic Epitaxial Lateral Growth in GaN Selective Area Epitaxy", Appl. Phys. Lett. 71 (9), Sep. 1, 1997, pp. 1204–1206.

Usui et al., "Thick GaN Epitaxial Growth With Low Dislocation Density by Hydride Vapor Phase Epitaxy", Jpn. J. Appl. Phys., vol. 36, Part 2, No. 7B, Jul. 15, 1997, pp. 899–902.

Nam et al., Lateral Epitaxy of Low Defect Density GaN Layers Via Organometallic Vapor Phase Epitaxy, Appl. Phys. Lett., vol. 71, No. 18, Nov. 3, 1997, pp. 2638–2640.

Zheleva et al., Dislocation Density Reduction Via Lateral Epitaxy in Selectively Grown GaN Structures, Appl. Phys. Lett., vol. 71, No. 17, Oct. 27, 1997, pp. 2472–2474.

Nam, et al., "Growth of GaN and $Al_{0.2}Ga_{0.8}N$ on Patterned Substrates Via Organometallic Vapor Phase Epitaxy", Jpn. J. Appl. Phys., vol. 36, Part 2, No. 5A, May 1, 1997, pp. 532–535.

Nam et al., "Selective Growth of GaN and $Al_{0.2}Ga_{0.8}N$ on GaN/AlN/6H–SiC(0001) Multilayer Substrates Via Organometallic Vapor Phase Epitaxy", Proceedings MRS, Dec. 1996, 6 pp.

Steckl et al., SiC Rapid Thermal Corbonization of the (111)Si Semiconductor–on–Insulator Structure and Subsequent Metalorganic Chemical Vapor Deposition, Appl. Phys. Let., 69 (15), Oct. 7, 1996, pp. 2264–2266.

Kapolnek et al., "Selective Area Epitaxy of GaN for Electron Field Emission Devices", Journal of Crystal Growth, 5451, 1996, pp. 1–4.

Weeks et al, "GaN Thin Films Deposited Via Organometallic Vapor Phase Epitaxy on α(6H)–SiC(0001) Using High–Temperature Monocrystalline AlN Buffer Layers", Appl. Phys. Lett. 67 (3), Jul. 17, 1995, pp. 401–403.

Doverspike et al., The Effect of GaN and AlN Buffer Layers on GaN Film Properties Grown on Both C–Plane and A–Plane Sapphire, Journal of Electronic Materials, vol. 24, No. 4, 1995, pp. 269–273.

Kato et al., "Selective Growth of Wurtzite GaN and $Al_xGa_{1-x}N$ on GaN/Sapphire Substrates by Metalorganic Vapor Phase Epitaxy", Journal of Crystal Growth, 144, 1994, pp. 133–140.

Kuznia et al., Influence of Buffer Layers on the Deposition of High Quality Single Crystal GaN Over Sapphire Substrates, J. Appl. Phys., vol. 73, No. 9, May 1, 1993, pp. 4700–4702.

Watanabe et al., The Growth of Single Crystalline GaN on a Si Substrate Using AlN As An Intermediate Layer, Journal of Crystal Growth, vol. 128, 1993, pp. 391–396.

Yamaguchi et al, "Lateral Supply Mechanisms in Selective Metalorganic Chemical Vapor Deposition", Jpn. Appl. Phys., vol. 32 (1993), pp. 1523–1527.

Nakamura, GaN Growth Using GaN Buffer Layer, Japanese Journal of Applied Physics, vol. 30, No. 10A, Oct. 1991, pp. L1705–L1707.

Chen et al., Silicon–on–Insulator: Why, How, and When, AIP Conference Proceedings, vol. 167, No. 1, Sep. 15, 1988, pp. 310–319.

Amano et al., Metalorganic Vapor Phase Epitaxial Growth of a High Quality GaN Film Using an AlN Buffer Layer, Applied Physics Letters, vol. 48, No. 5, Feb. 3, 1986, pp. 353–355.

Yoshida et al., Improvements on the Electrical and Luminescent Properties of Reactive Molecular Beam Epitaxially Grown GaN Films by Using AlN–Coated Sapphire Substrates, Applied Physics Letters, vol. 42, No. 5, Mar. 1, 1983, pp. 427–429.

* cited by examiner

METHODS OF FABRICATING GALLIUM NITRIDE MICROELECTRONIC LAYERS ON SILICON LAYERS

CROSS-REFERENCE TO RELATED APPLICATIONS

This application is a continuation of application Ser. No. 09/441,754, filed Nov. 17, 1999 now U.S. Pat No. 6,255,198, entitled Methods of Fabricating Gallium Nitride Microelectronic Layers on Silicon Layers and Gallium Nitride Microelectronic Structures Formed Thereby, and also claims the benefit of Provisional Application Ser. No. 60/109,674, filed Nov. 24, 1998 entitled Methods for Growing Low Defect Gallium Nitride Semiconductor Layers on Silicon or Silicon Containing Wafers Using a Conversion and Lateral Epitaxial Overgrowth Transition Structure and Gallium Nitride Semiconductor Structures Fabricated Thereby and Provisional Application Ser. No. 60/109,860 filed Nov. 24, 1998 entitled Pendeo-Epitaxial Methods of Fabricating Gallium Nitride Semiconductor Layers on Silicon Wafers or Wafers Containing Silicon, and Gallium Nitride Semiconductor Structures Fabricated Thereby.

FEDERALLY SPONSORED RESEARCH

This invention was made with Government support under Office of Naval Research Contract Nos. N00014-96-1-0765, N00014-98-1-0384, and N00014-98-1-0654. The Government may have certain rights to this invention.

Information contained in this application may be related to information contained in commonly assigned, U S. Pat. Nos. 6,261,929, 6,380,108, 6,403,451, 6,486,042, and 6,489,221, and commonly assigned, pending U.S. patent applications Ser. No. 09/736,569 filed Dec. 13, 2000, 09/899,586, filed Jul. 3, 2001, 09/973,383 filed Oct. 9, 2001, 10/115,354 filed Apr. 3, 2002, and 10/115,706 filed Apr. 4, 2002.

1. Field of the Invention

This invention relates to microelectronic devices and fabrication methods, and more particularly to gallium nitride semiconductor devices and fabrication methods therefor.

2. Background of the Invention

Gallium nitride is being widely investigated for microelectronic devices including but not limited to transistors, field emitters and optoelectronic devices. It will be understood that, as used herein, gallium nitride also includes alloys of gallium nitride such as aluminum gallium nitride, indium gallium nitride and aluminum indium gallium nitride.

A major problem in fabricating gallium nitride-based microelectronic devices is the fabrication of gallium nitride semiconductor layers having low defect densities. It is known that one contributor to defect density is the substrate on which the gallium nitride layer is grown. Accordingly, although gallium nitride layers have been grown on sapphire substrates, it is known to reduce defect density by growing gallium nitride layers on aluminum nitride buffer layers which are themselves formed on silicon carbide substrates. Notwithstanding these advances, continued reduction in defect density is desirable.

It also is known to produce low defect density gallium nitride layers by forming a mask on a layer of gallium nitride, the mask including at least one opening that exposes the underlying layer of gallium nitride, and laterally growing the underlying layer of gallium nitride through the at least one opening and onto the mask. This technique often is referred to as "Epitaxial Lateral Overgrowth" (ELO). The layer of gallium nitride may be laterally grown until the gallium nitride coalesces on the mask to form a single layer on the mask. In order to form a continuous layer of gallium nitride with relatively low defect density, a second mask may be formed on the laterally overgrown gallium nitride layer, that includes at least one opening that is offset from the underlying mask. ELO then again is performed through the openings in the second mask to thereby overgrow a second low defect density continuous gallium nitride layer. Microelectronic devices then may be formed in this second overgrown layer. ELO of gallium nitride is described, for example, in the publications entitled *Lateral Epitaxy of Low Defect Density GaN Layers Via Organometallic Vapor Phase Epitaxy* to Nam et al., Appl. Phys. Lett. Vol. 71, No. 18, Nov. 3, 1997, pp. 2638–2640; and *Dislocation Density Reduction Via Lateral Epitaxy in Selectively Grown GaN Structures* to Zheleva et al, Appl. Phys. Lett., Vol. 71, No. 17, Oct. 27, 1997, pp. 2472–2474, the disclosures of which are hereby incorporated herein by reference.

It also is known to produce a layer of gallium nitride with low defect density by forming at least one trench or post in an underlying layer of gallium nitride to define at least one sidewall therein. A layer of gallium nitride is then laterally grown from the at least one sidewall. Lateral growth preferably takes place until the laterally grown layers coalesce within the trenches. Lateral growth also preferably continues until the gallium nitride layer that is grown from the sidewalls laterally overgrows onto the tops of the posts. In order to facilitate lateral growth and produce nucleation of gallium nitride and growth in the vertical direction, the top of the posts and/or the trench floors may be masked. Lateral growth from the sidewalls of trenches and/or posts also is referred to as "pendeoepitaxy" and is described, for example, in publications entitled *Pendeo-Epitaxy: A New Approach for Lateral Growth of Gallium Nitride Films* by Zheleva et al., Journal of Electronic Materials, Vol. 28, No. 4, February 1999, pp. L5–L8; and *Pendeoepitaxy of Gallium Nitride Thin Films* by Linthicum et al., Applied Physics Letters, Vol. 75, No. 2, July 1999, pp. 196–198, the disclosures of which are hereby incorporated herein by reference.

ELO and pendeoepitaxy can provide relatively large, low defect gallium nitride layers for microelectronic applications. However, a major concern that may limit the mass production of gallium nitride devices is the growth of the gallium nitride layers on a silicon carbide substrate. Notwithstanding silicon carbide's increasing commercial importance, silicon carbide substrates still may be relatively expensive compared to conventional silicon substrates. Moreover, silicon carbide substrates generally are smaller than silicon substrates, which can reduce the number of devices that can be formed on a wafer. Moreover, although large investments are being made in silicon carbide processing equipment, even larger investments already have been made in conventional silicon substrate processing equipment. Accordingly, the use of an underlying silicon carbide substrate for fabricating gallium nitride microelectronic structures may adversely impact the cost and/or availability of gallium nitride devices.

SUMMARY OF THE INVENTION

The present invention provides methods of fabricating a gallium nitride microelectronic layer by converting a surface of a (111) silicon layer to 3C-silicon carbide. A layer of 3C-silicon carbide is then epitaxially grown on the converted surface of the (111) silicon layer. A layer of 2H-gallium nitride then is grown on the epitaxially grown layer of 3C-silicon carbide. The layer of 2H-gallium nitride then is laterally grown to produce the gallium nitride microelectronic layer.

In one embodiment, the silicon layer is a (111) silicon substrate, the surface of which is converted to 3C-silicon carbide. In another embodiment, the (111) silicon layer is part of a Separation by IMplanted OXygen (SIMOX) silicon substrate which includes a layer of implanted oxygen that defines the (111) layer on the (111) silicon substrate. In yet another embodiment, the (111) silicon layer is a portion of a Silicon-On-Insulator (SOI) substrate in which a (111) silicon layer is bonded to a substrate. Accordingly, the present invention can use conventional bulk silicon, SIMOX and SOI substrates as a base or platform for fabricating a gallium nitride microelectronic layer. By using conventional silicon technology, low cost and/or large area silicon substrates may be used and conventional silicon wafer processing systems also may be used. Accordingly, low cost and/or high volume production of gallium nitride microelectronic layers may be provided.

The surface of the (111) silicon layer preferably is converted to 3C-silicon carbide by chemically reacting the surface of the (111) silicon layer with a carbon containing precursor such as ethylene, to convert the surface of the (111) silicon layer to 3C-silicon carbide. The layer of 3C-silicon carbide then may be epitaxially grown on the converted surface using standard vapor phase epitaxial techniques for silicon carbide. Alternatively, the layer of 3C-silicon carbide may be grown directly on the (111) silicon layer, without the need for conversion. The epitaxially grown layer of 3C-silicon carbide may be thinned. Prior to growing the layer of gallium nitride, an aluminum nitride and/or gallium nitride buffer layer preferably is grown on the epitaxially grown layer of 3C-silicon carbide. The gallium nitride then is grown on the buffer layer, opposite the epitaxially grown layer of 3C-silicon carbide.

Lateral growth of the layer of 2H-gallium nitride may be performed by ELO wherein a mask is formed on the layer of 2H-gallium nitride, the mask including at least one opening that exposes the layer of 2H-gallium nitride. The layer of 2H-gallium nitride then is laterally grown through the at least one opening and onto the mask. A second, offset mask also may be formed on the laterally grown layer of 2H-gallium nitride and a second laterally grown layer of 2H-gallium nitride may be overgrown onto the offset mask. Lateral growth of the layer of 2H-gallium nitride also may be performed using pendeoepitaxial techniques wherein at least one trench and/or post is formed in a layer of 2H-gallium nitride to define at least one sidewall therein. The layer of 2H-gallium nitride then is laterally grown from the at least one sidewall. Pendeoepitaxial lateral growth preferably continues until the laterally grown sidewalls coalesce on the top of the posts or trenches. The top of the posts and/or the trench floors may be masked to promote lateral growth and reduce nucleation and vertical growth. The trenches preferably extend into the silicon carbide layer to also reduce nucleation and vertical growth.

As described above, the present invention can use bulk silicon substrates, SIMOX substrates or SOI substrates as a platform for gallium nitride fabrication. Preferred methods using each of these substrates now will be described.

When using a (111) silicon substrate, the surface of the (111) silicon substrate preferably is converted to 3C-silicon carbide and a layer of 3C-silicon carbide then is epitaxially grown on the converted surface of the (111) silicon substrate. The epitaxially grown layer of 3C-silicon carbide may be thinned. An aluminum nitride and/or gallium nitride buffer layer is grown on the epitaxially grown layer of 3C-silicon carbide. A layer of 2H-gallium nitride is grown on the buffer layer. The layer of 2H-gallium nitride then is laterally grown to produce the gallium nitride microelectronic layer. The lateral growth may proceed using ELO, pendeoepitaxy and/or other techniques.

When using a SIMOX substrate, oxygen is implanted into a (111) silicon substrate to form a buried silicon dioxide layer that defines a (111) silicon surface layer on the (111) silicon substrate. At least a portion of the (111) silicon surface layer, and preferably all of the (111) silicon surface layer, is converted to 3C-silicon carbide. A layer of 3C-silicon carbide then is epitaxially grown on the converted (111) silicon surface layer. The epitaxially grown layer of 3C-silicon carbide then may be thinned and an aluminum nitride and/or gallium nitride buffer layer is grown on the epitaxially grown layer of 3C-silicon carbide. A layer of 2H-gallium nitride then is grown on the buffer layer. The layer of 2H-gallium nitride then is laterally grown, using ELO, pendeoepitaxy and/or other techniques to produce the gallium nitride microelectronic layer.

Finally, when using an SOI substrate, a (111) silicon substrate is bonded to another substrate, preferably a (100) silicon substrate. The (111) silicon substrate is thinned to define a (111) silicon layer on the (100) silicon substrate. At least a portion, and preferably all, of the (111) silicon layer is converted to 3C-silicon carbide. A layer of 3C-silicon carbide is epitaxially grown on the converted (111) silicon layer. The epitaxially grown layer of 3C-silicon carbide may be thinned and an aluminum nitride and/or gallium nitride buffer layer is grown on the epitaxially grown layer of 3C-silicon carbide. A layer of 2H-gallium nitride then is grown on the buffer layer and the layer of 2H-gallium nitride is laterally grown, using ELO, pendeoepitaxy and/or other techniques to produce the gallium nitride microelectronic layer. When using SOI substrates, microelectronic devices also may be formed in the (100) silicon substrate, prior to or after forming the gallium nitride microelectronic layer. A portion of the (111) silicon layer, the 3C-silicon carbide layer, the gallium nitride layer and the gallium nitride microelectronic layer may be removed to expose the microelectronic devices in the (100) silicon substrate. Alternatively, an epitaxial silicon layer may be grown from the exposed portion of the (100) silicon substrate, and microelectronic devices may be formed in the epitaxial silicon layer. The gallium nitride structures may be capped prior to forming the epitaxial silicon layer. Thus, for example, optoelectronic devices may be formed in the gallium nitride layer whereas conventional CMOS or other microelectronic devices may be formed in the (100) silicon substrate. Integrated optoelectronic substrates thereby may be formed.

In general, gallium nitride microelectronic structures according to the present invention preferably comprise a (111) silicon layer, a 3C-silicon carbide layer on the (111) silicon layer, an underlying layer of 2H-gallium nitride on the 3C-silicon carbide layer and a lateral layer of 2H-gallium nitride on the underlying layer of 2H-gallium nitride. The (111) silicon layer may comprise a surface of a (111) bulk silicon substrate, a surface of a (111) SIMOX substrate or a surface of a (111) SOI substrate. A buffer layer of aluminum nitride and/or gallium nitride may be provided between the 3C-silicon carbide layer and the underlying layer of 2H-gallium nitride. A mask may be provided on the underlying layer of 2H-gallium nitride, the mask including at least one opening that exposes the underlying layer of 2H-gallium nitride, and the lateral layer of 2H-gallium nitride extending through the at least one opening and onto the mask. A second laterally offset mask and a second lateral layer of 2H-gallium nitride also may be provided. Alternatively or in addition, at least one trench and/or post may be provided in the underlying layer of 2H-gallium nitride that defines at least one sidewall in the underlying layer of 2H-gallium nitride, and the lateral layer of 2H-gallium nitride may extend from the at least one sidewall. The lateral layer of 2H-gallium nitride may extend onto the post tops, which may be masked or unmasked. The trench bottoms also may be masked or the trench may extend through the aluminum nitride layer into the silicon carbide layer.

A preferred embodiment using a (111) bulk silicon substrate includes a 3C-silicon carbide layer on the (111) silicon substrate, a buffer layer of aluminum nitride and/or gallium nitride on the 3C-silicon carbide layer, an underlying layer of 2H-gallium nitride on the buffer layer and a lateral layer of 2H-gallium nitride on the underlying layer of 2H-gallium nitride. A preferred embodiment using a SIMOX substrate includes a (111) silicon substrate, a silicon dioxide layer on the (111) silicon substrate, a 3C-silicon carbide layer on the silicon dioxide layer, a buffer layer of aluminum nitride and/or gallium nitride on the 3C-silicon carbide layer, an underlying layer of 2H-gallium nitride on the buffer layer and a lateral layer of 2H-gallium nitride on the underlying layer of 2H-gallium nitride. Finally, a preferred embodiment using an SOI substrate includes a (100) silicon substrate, an insulating layer on the (100) silicon substrate, a 3C-silicon carbide layer on the insulating layer, a buffer layer of aluminum nitride and/or gallium nitride on the 3C-silicon carbide layer, an underlying layer of 2H-gallium nitride on the buffer layer and a lateral layer of 2H-gallium nitride on the underlying layer of 2H-gallium nitride. A plurality of microelectronic devices preferably are formed in the (100) silicon substrate. The 3C-silicon carbide layer, the layer of aluminum nitride, the underlying layer of 2H-gallium nitride and the lateral layer of 2H-gallium nitride preferably define a pedestal that exposes the plurality of microelectronic devices in the (100) silicon substrate. Alternatively, the pedestal may expose the (100) silicon substrate, substrate, a (100) silicon layer may be included on the exposed portion of the (100) silicon substrate, and the microelectronic devices may be formed in the (100) silicon layer. In all of the above embodiments, a layer of (111) silicon may be present between the insulating layer and the 3C-silicon carbide layer. Accordingly, gallium nitride microelectronic structures may be formed on commonly used bulk silicon, SIMOX and SOI substrates. Low cost and/or high availability gallium nitride devices thereby may be provided. Integration with conventional CMOS or other silicon technologies also may be facilitated.

DETAILED DESCRIPTION OF PREFERRED EMBODIMENTS

Figure 1:
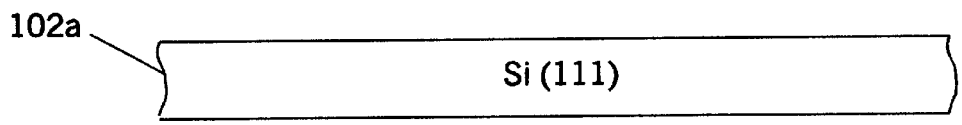
FIGS. 1–15 are cross-sectional views of first gallium nitride microelectronic structures during intermediate fabrication steps, according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or "onto" another element, it can be directly on the other element or intervening elements may also be present. Moreover, each embodiment described and illustrated herein includes its complementary conductivity type embodiment as well.

Figure 2:
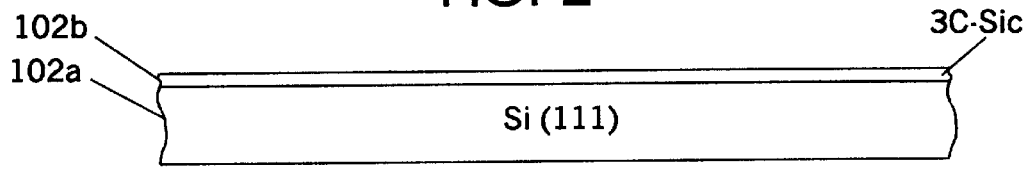

Referring now to FIGS. 1–14, first embodiments of methods of fabricating gallium nitride microelectronic layers and microelectronic structures formed thereby are illustrated. Referring to FIG. 1, a bulk silicon (111) substrate 102a is provided. The crystallographic designation conventions used herein are well known to those having skill in the art, and need not be described further. As shown in FIG. 2, the surface of the (111) silicon substrate 102a preferably is converted to 3C-silicon carbide 102b. In particular, the surface of the silicon substrate 102a may be converted to 3C-silicon carbide by exposure to one or more carbon-containing sources. For example, a converted layer of 3C—SiC may be formed by heating the bulk silicon substrate 102a using ethylene at about 925° C. for about fifteen minutes at a pressure of about 5E−5 Torr. More preferably, an ethylene flow rate of about 0.5 sccm is used while heating the substrate from room temperature to about 925° C. at a ramp up rate of about 30° C. per minute and holding at about 925° C. for about fifteen minutes and at about 5E−5 Torr, resulting in a thin, 50 Ångstrom, 3C-silicon carbide layer 102b.

Figure 3:
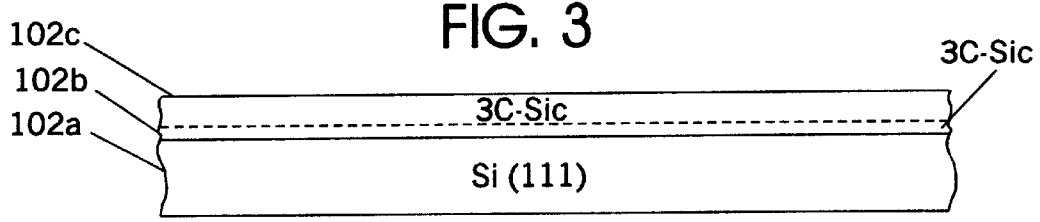

Then, referring to FIG. 3, a layer of 3C-silicon carbide 102c may be formed on the converted 3C-silicon carbide layer 102b using conventional vapor phase epitaxial techniques. For example, the silicon carbide layer may be grown using propane (about 15% in hydrogen) and silane (about 5% in hydrogen) at about 1360° C. and about 760 Torr. More preferably, propane (about 15% in hydrogen) at about 25 sccm, silane (about 5% in hydrogen) at about 100 sccm and hydrogen gas at about 2500 sccm at a temperature of about 1360° C. and pressure of about 760 Torr may be used. It will be understood that the surface of the silicon substrate need not be converted to 3C-silicon carbide prior to forming silicon carbide layer 102c. Rather, layer 102c may be formed directly on the silicon substrate 102a.

Figure 4:
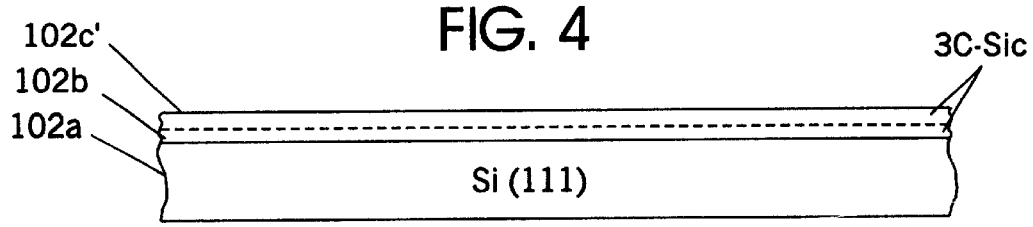

Then, referring to FIG. 4, the epitaxially grown layer of 3C-silicon carbide 102c may be thinned, for example, to a thickness of about 0.5 µm, to form a thin layer 102c' of 3C-silicon carbide. Thinning may take place using chemical mechanical polishing. The thinning may promote the formation of a smooth, defect free nucleation surface for 2H-aluminum nitride as will be described below. However, it will be understood that the 3C-silicon carbide layer 102c need not be thinned.

Figure 5:
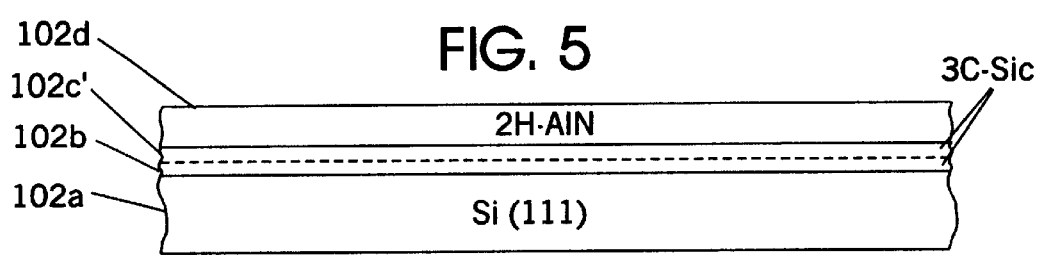
Figure 6:
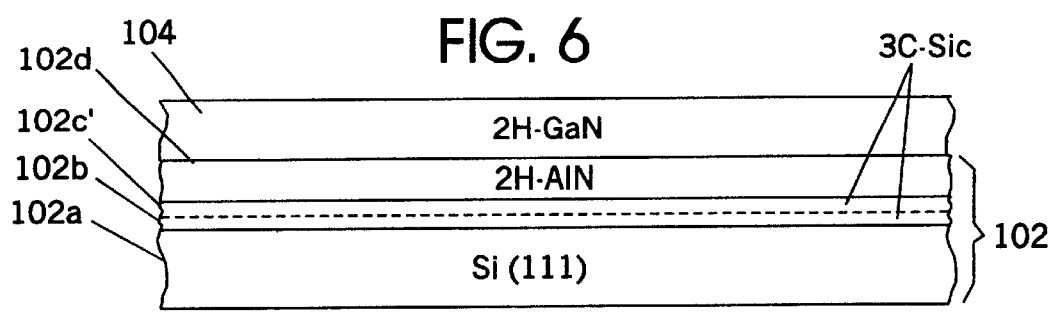

Referring now to FIG. 5, a buffer layer of 2H-aluminum nitride and/or gallium nitride 102d then is grown on the epitaxially grown layer of 3C-silicon carbide 102c or 102c'. The aluminum nitride layer 102d may be about 0.01 µm thick and may be formed using conventional techniques such as metalorganic vapor phase epitaxy. It also will be understood that the buffer layer of aluminum nitride and/or gallium nitride 102d need not be included, and gallium nitride may be formed directly on the epitaxially grown layer 102c/102c' of 3C-silicon carbide. The combination of the (111) silicon substrate 102a, the silicon carbide layers 102b and 102c' and the buffer layer 102d forms a platform 102 upon which a gallium nitride microelectronic layer may be fabricated. Thus, as shown in FIG. 6, an underlying 2H-gallium nitride layer 104 is grown on the 2H-aluminum nitride layer 102d. The gallium nitride layer 104 may be between about 0.5 and about 2.0 µm thick and may be grown at about 1000° C. in a cold wall vertical and inductively heated metal organic vapor phase epitaxy system using triethyl gallium at about 26 mµmol/min, ammonia at about 1500 sccm and about 3000 sccm hydrogen diluent. Additional details of the growth technique for the aluminum nitride layer 102d and the gallium nitride layer 104 may be found in a publication by T. W. Weeks et al. entitled *"GaN Thin Films Deposited Via Organometallic Vapor Phase Epitaxy on α(6H)-SiC(0001) Using High-Temperature Monocrystalline AlN Buffer Layers"*, Applied Physics Letters, Vol. 67, No. 3, Jul. 17, 1995, pp. 401–403.

Referring now to FIGS. 7–14, gallium nitride microelectronic layers may be fabricated on the underlying gallium nitride layer 104 using ELO. It also will be understood, however, that gallium nitride microelectronic layers may be fabricated using pendeoepitaxy as will be described in connection with other embodiments of the invention and/or using other techniques for fabricating gallium nitride microelectronic layers.

Figure 7:
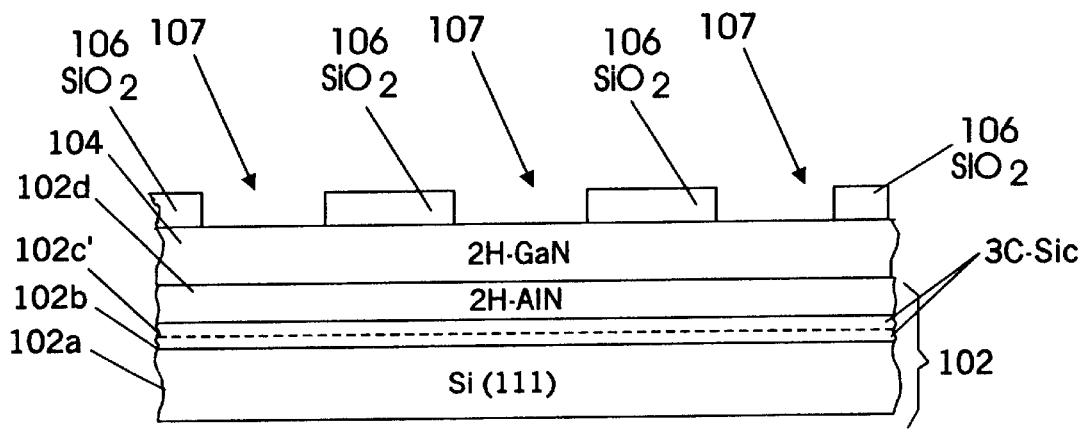

Referring to FIG. 7, the underlying gallium nitride layer 104 is masked with a first mask 106 that includes a first array of openings 107 therein. The first mask may comprise silicon dioxide at a thickness of 1000 Å and may be deposited using Low Pressure Chemical Vapor Deposition (LPCVD) at 410° C. Other masking materials may be used. The first mask may be patterned using standard photolithography techniques and etching in a buffered HF solution. In one embodiment, the first openings 107 are 3 µm-wide openings that extend in parallel at distances of between 3 and 40 µm and that are oriented along the <1$\bar{1}$00> direction on the underlying gallium nitride layer 104. Prior to further processing, the structure may be dipped in a 50% buffered hydrochloric acid (HCl) solution to remove surface oxides from the underlying gallium nitride layer 104.

Figure 8:
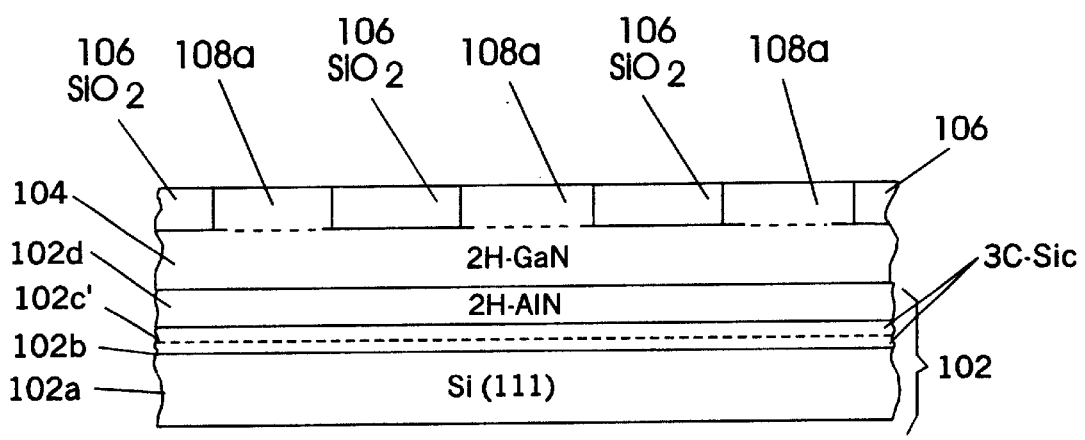

Referring now to FIG. 8, the underlying gallium nitride layer 104 is grown through the first array of openings 107 to form first vertical gallium nitride layer 108a in the first openings. Growth of gallium nitride may be obtained at 1000–1100° C. and 45 Torr. The precursors TEG at 13–39 µmol/min and NH$_3$ at 1500 sccm may be used in combination with a 3000 sccm H$_2$ diluent. If gallium nitride alloys are formed, additional conventional precursors of aluminum or indium, for example, may also be used. As shown in FIG. 8, the first gallium nitride layer 108a grows vertically to the top of the first mask 106.

It will be understood that underlying gallium nitride layer 104 also may be grown laterally without using a mask 106, by appropriately controlling growth parameters and/or by appropriately patterning the underlying gallium nitride layer 104. A patterned layer may be formed on the underlying gallium nitride layer after vertical growth or lateral growth, and need not function as a mask.

It will also be understood that lateral growth in two dimensions may be used to form an overgrown gallium nitride semiconductor layer. Specifically, mask 106 may be patterned to include an array of openings 107 that extend along two orthogonal directions such as <1$\bar{1}$00> and <11$\bar{2}$0>. Thus, the openings can form a rectangle of orthogonal striped patterns. In this case, the ratio of the edges of the rectangle is preferably proportional to the ratio of the growth rates of the $\{11\bar{2}0\}$ and $\{1\bar{1}01\}$ facets, for example, in a ratio of 1.4:1.

Figure 9:
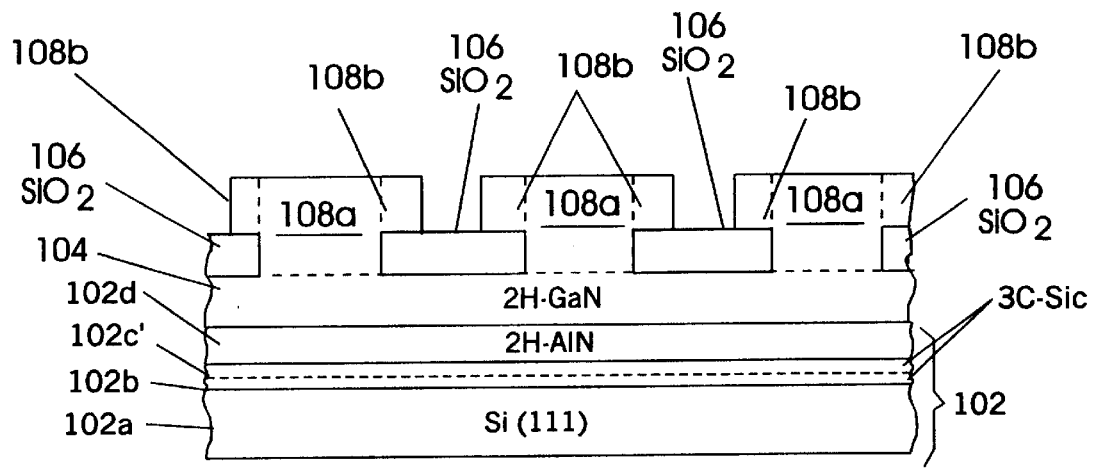

Referring now to FIG. 9, continued growth of the first gallium nitride layer 108a causes lateral overgrowth onto the first mask 106, to form first lateral gallium nitride layer 108b. Growth conditions for overgrowth may be maintained as was described in connection with FIG. 8.

Figure 10:
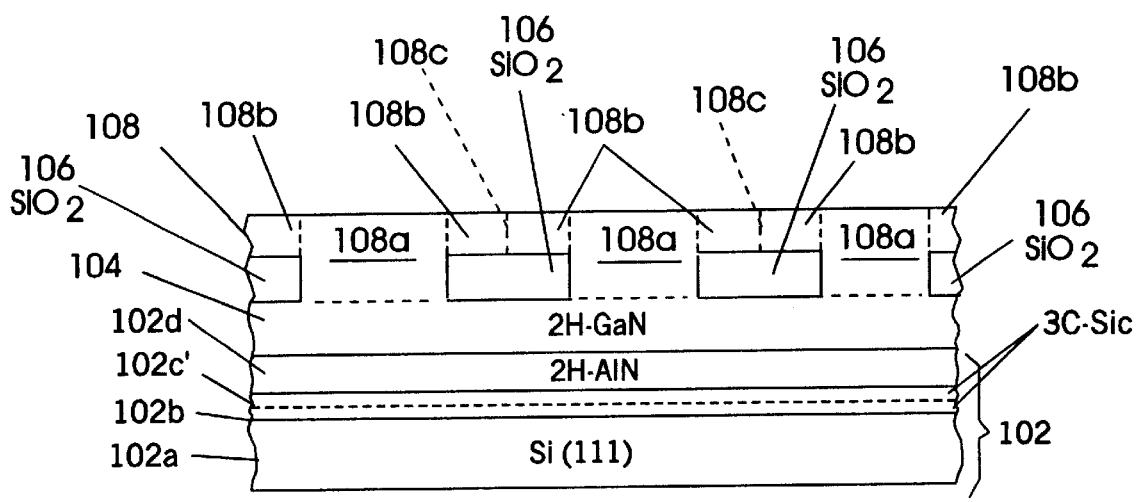

Referring now to FIG. 10, lateral overgrowth is optionally allowed to continue until the lateral growth fronts coalesce at first interfaces 108c, to form a first continuous gallium nitride layer 108. The total growth time may be approximately 60 minutes. Microelectronic devices may be formed in the first continuous gallium nitride layer 108.

Figure 11:
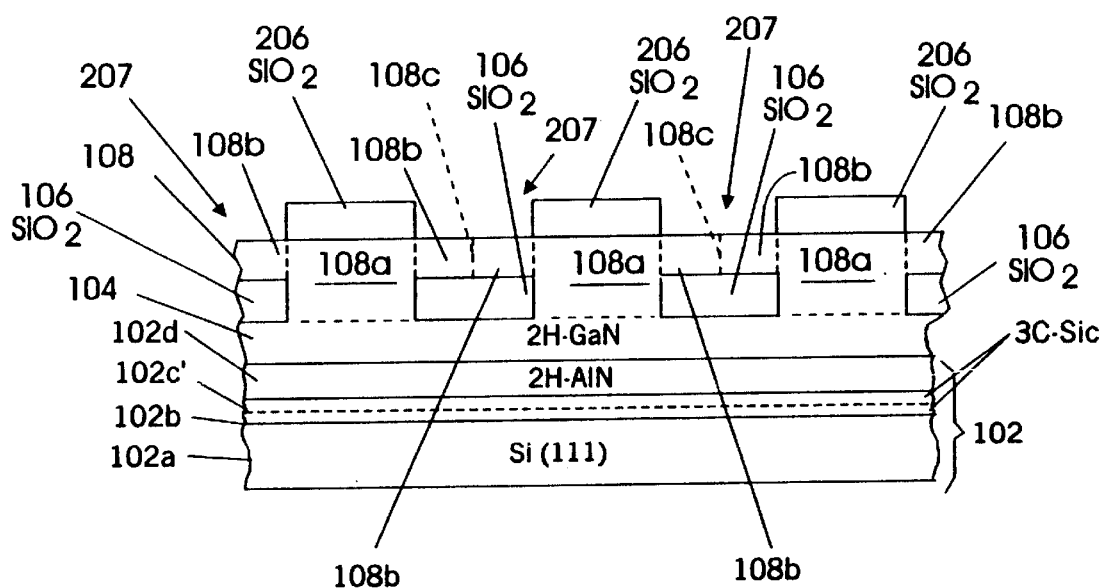

Optionally, referring now to FIG. 11, the first vertical gallium nitride layer 108a is masked with a second mask 206 that includes a second array of openings 207 therein. The second mask may be fabricated as was described in connection with the first mask. The second mask may also be eliminated, as was described in connection with the first mask of FIG. 8. As already noted, the second mask 206 preferably covers the entire first vertical gallium nitride layer 108a, so as to prevent defects therein from propagating vertically or laterally. In order to provide defect-free propagation, mask 206 may extend onto first lateral gallium nitride layer 108b as well.

Figure 12:
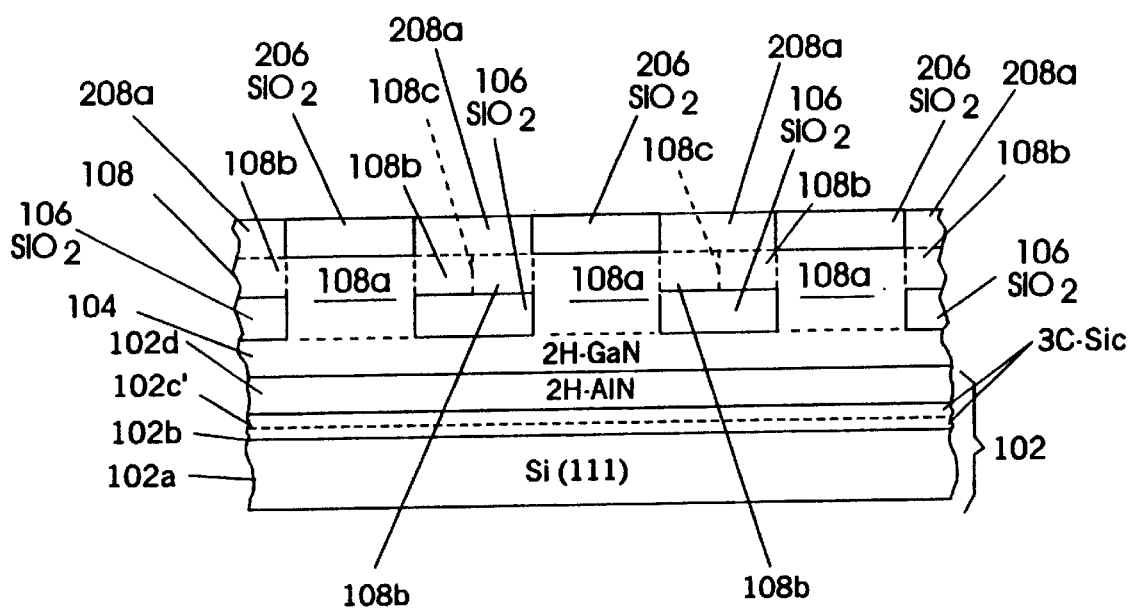

Referring now to FIG. 12, the first lateral gallium nitride layer 108c is grown vertically through the second array of openings 207, to form second vertical gallium nitride layer 208a in the second openings. Growth may be obtained as was described in connection with FIG. 8.

Figure 13:
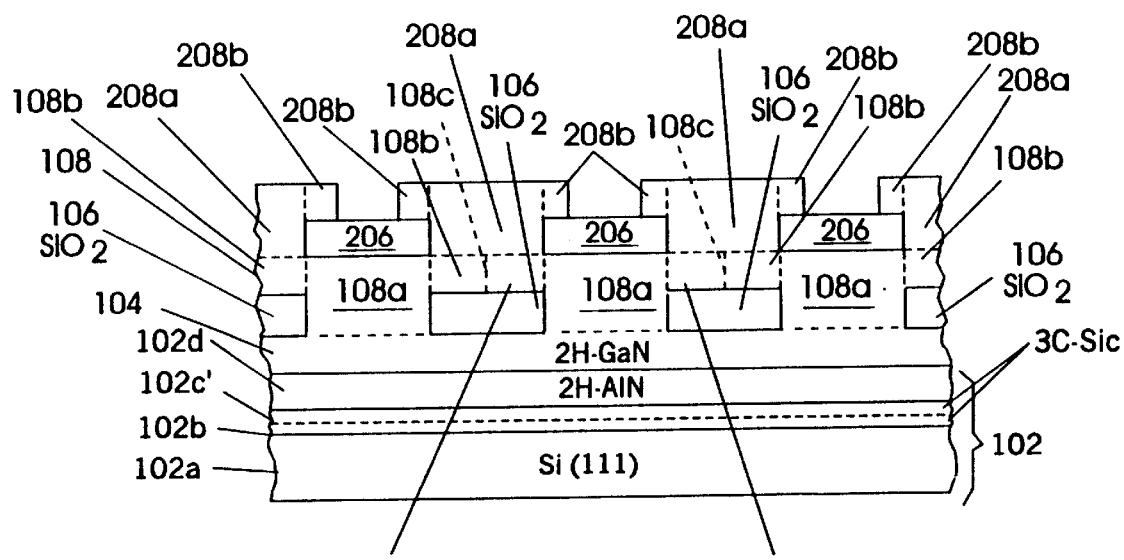

Referring now to FIG. 13, continued growth of the second gallium nitride layer 208a causes lateral overgrowth onto the second mask 206, to form second lateral gallium nitride layer 208b. Lateral growth may be obtained as was described in connection with FIG. 8.

Figure 14:
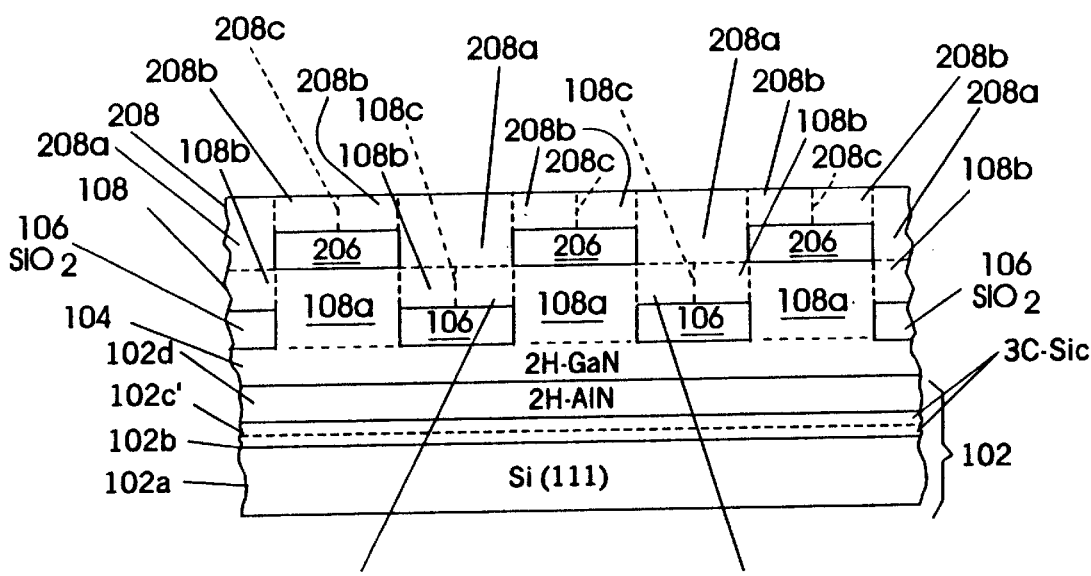
Figure 15:
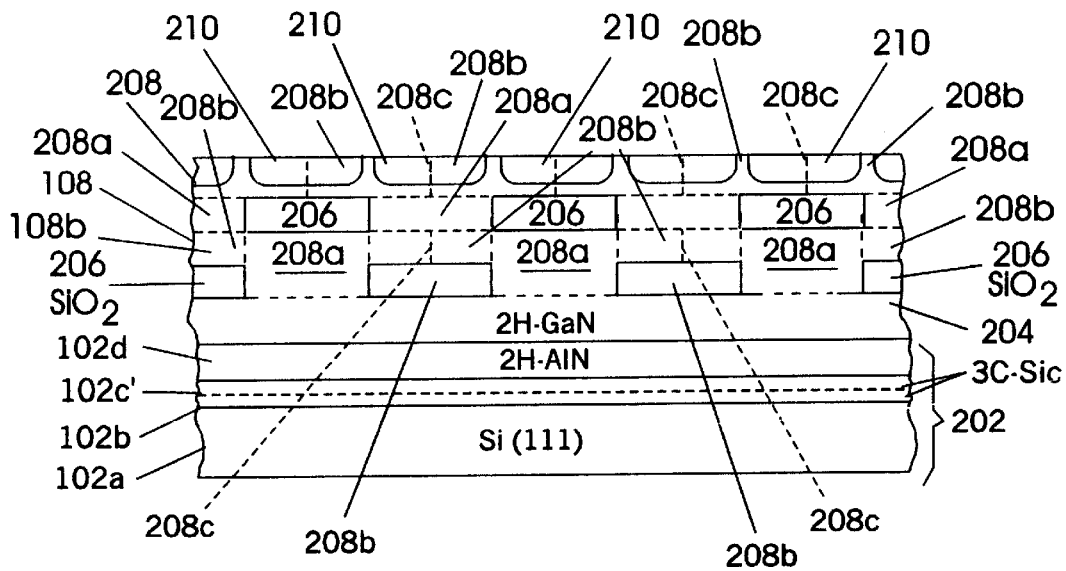
Figure 16:
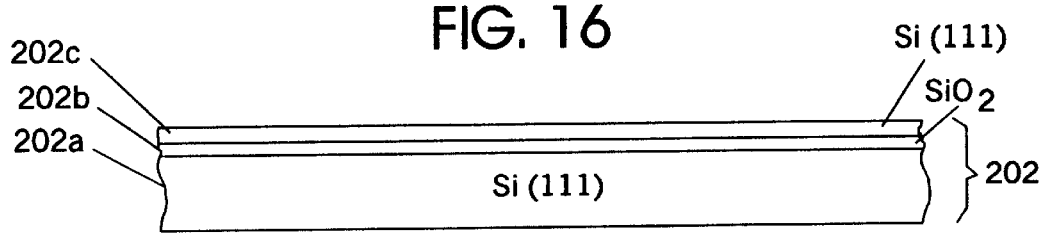
FIGS. 16–26 are cross-sectional views of second gallium nitride microelectronic structures during intermediate fabrication steps, according to the present invention.

Referring now to FIG. 14, lateral overgrowth preferably continues until the lateral growth fronts coalesce at second interfaces 208c to form a second continuous gallium nitride layer 208. Total growth time may be approximately 60 minutes. Microelectronic devices may then be formed in regions 208a and in regions 208b as shown in FIG. 15, because both of these regions are of relatively low defect density. Devices may bridge these regions as well, as shown. Accordingly, a continuous device quality gallium nitride layer 208 may be formed.

Additional discussion of the methods and structures of the present invention will now be provided. As described above, the openings 107 and 207 in the masks are preferably rectangular stripes that preferably extend along the <11$\bar{2}$0> and/or <1$\bar{1}$00> directions relative to the underlying gallium nitride layer 104. Truncated triangular stripes having (1$\bar{1}$01) slant facets and a narrow (0001) top facet may be obtained for mask openings 107 and 207 along the <11$\bar{2}$0> direction. Rectangular stripes having a (0001) top facet, (11$\bar{2}$0) vertical side faces and (1$\bar{1}$01) slant facets may be grown along the <1$\bar{1}$00> direction. For growth times up to 3 minutes, similar morphologies may be obtained regardless of orientation. The stripes develop into different shapes if the growth is continued.

The amount of lateral growth generally exhibits a strong dependence on stripe orientation. The lateral growth rate of the <1$\bar{1}$00> oriented stripes is generally much faster than those along <11$\bar{2}$0>. Accordingly, it is most preferred to orient the openings 107 and 207 so that they extend along the <1$\bar{1}$00> direction of the underlying gallium nitride layer 104.

The different morphological development as a function of opening orientation appears to be related to the stability of the crystallographic planes in the gallium nitride structure. Stripes oriented along <11$\bar{2}$0> may have wide (1$\bar{1}$00) slant facets and either a very narrow or no (0001) top facet depending on the growth conditions. This may be because (1$\bar{1}$00) is the most stable plane in the gallium nitride wurtzite crystal structure, and the growth rate of this plane is lower than that of others. The {1$\bar{1}$01} planes of the <1$\bar{1}$00 > oriented stripes may be wavy, which implies the existence of more than one Miller index. It appears that competitive growth of selected {1$\bar{1}$01} planes occurs during the deposition which causes these planes to become unstable and which causes their growth rate to increase relative to that of the (1$\bar{1}$01) of stripes oriented along <11$\bar{2}$0>.

The morphologies of the gallium nitride layers selectively grown on openings oriented along <1$\bar{1}$00> are also generally a strong function of the growth temperatures. Layers grown at 1000° C. may possess a truncated triangular shape. This morphology may gradually change to a rectangular cross-section as the growth temperature is increased. This shape change may occur as a result of the increase in the diffusion coefficient and therefore the flux of the gallium species along the (0001) top plane onto the {1$\bar{1}$01} planes with an increase in growth temperature. This may result in a decrease in the growth rate of the (0001) plane and an increase in that of the {1$\bar{1}$01}. This phenomenon has also been observed in the selective growth of gallium arsenide on silicon dioxide. Accordingly, temperatures of 1100° C. appear to be most preferred.

The morphological development of the gallium nitride regions also appears to depend on the flow rate of the TEG. An increase in the supply of TEG generally increases the growth rate of the stripes in both the lateral and the vertical directions. However, the lateral/vertical growth rate ratio decrease from 1.7 at the TEG flow rate of 13 $\mu$mol/min to 0.86 at 39 $\mu$mol.min. This increased influence on growth rate along <0001> relative to that of <11$\bar{2}$0> with TEG flow rate may be related to the type of reactor employed, wherein the reactant gases flow vertically and perpendicular to the substrate. The considerable increase in the concentration of the gallium species on the surface may sufficiently impede their diffusion to the {1$\bar{1}$01} planes such that chemisorption and gallium nitride growth occur more readily on the (0001) plane.

Continuous 2 $\mu$m thick gallium nitride layers 108 and 208 may be obtained using 3 $\mu$m wide stripe openings 107 and 207 spaced 7 $\mu$m apart and oriented along <1$\bar{1}$00>, at 1100 ° C. and a TEG flow rate of 26 $\mu$mol/min. The overgrown gallium nitride layers 108*b* and 208*b* may include subsurface voids that form when two growth fronts coalesce. These voids may occur most often using lateral growth conditions wherein rectangular stripes having vertical {11$\bar{2}$0} side facets developed.

The coalesced gallium nitride layers 108 and 208 may have a microscopically flat and pit-free surface. The surfaces of the laterally grown gallium nitride layers may include a terrace structure having an average step height of 0.32 nm. This terrace structure may be related to the laterally grown gallium nitride, because it is generally not included in much larger area films grown only on aluminum nitride buffer layers. The average RMS roughness values may be similar to the values obtained for the underlying gallium nitride layers 104.

Threading dislocations, originating from the interface between the gallium nitride underlayer 104 and the buffer layer 102*b*, appear to propagate to the top surface of the first vertical gallium nitride layer 108*a* within the first openings 107 of the first mask 106. The dislocation density within these regions is approximately $10^9$ cm$^{-2}$. By contrast, threading dislocations do not appear to readily propagate into the first overgrown regions 108*b*. Rather, the first overgrown gallium nitride regions 108*b* contain only a few dislocations. These few dislocations may be formed parallel to the (0001) plane via the extension of the vertical threading dislocations after a 90° bend in the regrown region. These dislocations do not appear to propagate to the top surface of the first overgrown GaN layer. Since both the second vertical gallium nitride layer 208*a* and the second lateral gallium nitride layer 208*b* propagate from the low defect first overgrown gallium nitride layer 108*b*, the entire layer 208 can have low defect density.

As described, the formation mechanism of the selectively grown gallium nitride layer is lateral epitaxy. The two main stages of this mechanism are vertical growth and lateral growth. During vertical growth, the deposited gallium nitride grows selectively within the mask openings 107 and 207 more rapidly than it grows on the masks 106 and 206, apparently due to the much higher sticking coefficient "s" of the gallium atoms on the gallium nitride surface (s=1) compared to on the mask (s~1). Since the SiO$_2$ bond strength is 799.6 kJ/mole and much higher than that of Si—N (439 kJ/mole), Ga—N (103 kJ/mole), and Ga—O (353.6 kJ/mole), Ga or N atoms should not readily bond to the mask surface in numbers and for a time sufficient to cause gallium nitride nuclei to form. They would either evaporate or diffuse along the mask surface to the openings 107 or 207 in the masks or to the vertical gallium nitride surfaces 108*a* or 208*a* which have emerged. During lateral growth, the gallium nitride grows simultaneously both vertically and laterally over the mask from the material which emerges over the openings.

Surface diffusion of gallium and nitrogen on the masks may play a minor role in gallium nitride selective growth. The major source of material appears to be derived from the gas phase. This may be demonstrated by the fact that an increase in the TEG flow rate causes the growth rate of the (0001) top facets to develop faster than the (1$\bar{1}$01) side facets and thus controls the lateral growth.

The laterally grown gallium nitride layers 108*b* and 208*b* bond to the underlying masks 106 and 206 sufficiently strongly so that they generally do not break away on cooling. However, lateral cracking within the SiO$_2$ may take place due to thermal stresses generated on cooling. The viscosity ($\rho$) of the SiO$_2$ at 1050° C. is about $10^{15.5}$ poise which is one order of magnitude greater than the strain point (about $10^{14.5}$ poise) where stress relief in a bulk amorphous material occurs within approximately six hours. Thus, the $SiO_2$ mask may provide limited compliance on cooling. As the atomic arrangement on the amorphous $SiO_2$ surface is quite different from that on the GaN surface, chemical bonding may occur only when appropriate pairs of atoms are in close proximity. Extremely small relaxations of the silicon and oxygen and gallium and nitrogen atoms on the respective surfaces and/or within the bulk of the $SiO_2$ may accommodate the gallium nitride and cause it to bond to the oxide.

Accordingly, regions of lateral epitaxial overgrowth through mask openings from an underlying gallium nitride layer may be achieved via MOVPE. The growth may depend strongly on the opening orientation, growth temperature and TEG flow rate. Coalescence of overgrown gallium nitride regions to form regions with both extremely low densities of dislocations and smooth and pit-free surfaces may be achieved through 3 μm wide mask openings spaced 7 μm apart and extending along the <1$\bar{1}$00> direction, at 1100° C. and a TEG flow rate of 26 μmol/min. The lateral overgrowth of gallium nitride via MOVPE may be used to obtain low defect density continuous gallium nitride layers for microelectronic devices.

The embodiments of FIGS. 1–15 can use bulk (111) silicon substrate 102a, a 3C-silicon carbide layer 102b/102c' and a buffer layer 102d as a platform 102 on which to grow high quality gallium nitride microelectronic layers. The silicon carbide layer 102b/102c' may be critical to the success of forming gallium nitride structures according to the present invention. First, silicon carbide is a preferred material template on which to grow the buffer layer 102d and the gallium nitride semiconductor layer 104. Moreover, the silicon carbide layer may provide a diffusion barrier to prevent the interaction of silicon atoms with gallium and nitrogen species found in the growth environment. If there is no diffusion barrier or a diffusion barrier of insufficient thickness is present, then at elevated temperatures that are used for lateral epitaxial growth, the silicon atoms from the silicon substrate may have sufficient energy and mobility to diffuse to the surface of the aluminum nitride buffer layer and to react with the gallium and nitrogen species in the growth environment. This may result in the formation of large voids in the underlying silicon substrate and in the "poisoning" of the gallium nitride growth, which may result in the undesirable formation of polycrystalline gallium nitride-containing structures. Referring now to FIGS. 16–26, second embodiments of fabricating gallium nitride microelectronic layers according to the present invention will be described. In contrast with the embodiment of FIGS. 1–15, the embodiments of FIGS. 16–26 begin with a (111) silicon SIMOX substrate 202 including a buried layer of silicon dioxide 202b therein that define a (111) silicon surface layer 202c on an underlying (111) silicon substrate 202a. See FIG. 16. The buried layer of silicon dioxide may be fabricated by implanting oxygen into a (111) silicon substrate to define a (111) silicon surface layer on the (111) silicon substrate. This process generally is referred to as SIMOX and is described for example in a publication entitled *Silicon-on-Insulator: Why, How, and When* by Chen, AIP Conference Proceedings, Vol. 167, No. 1, Sep. 15, 1988, pp. 310–319.

Figure 17:
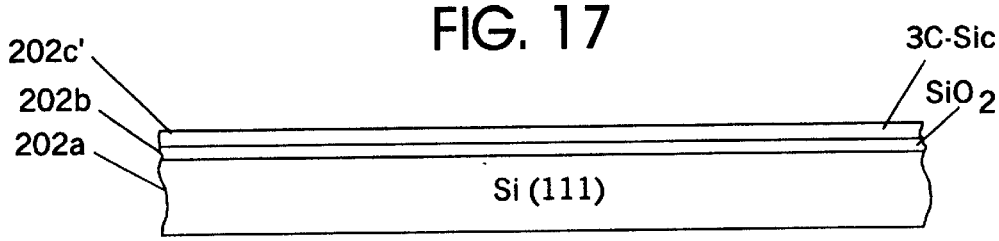

Then, referring to FIG. 17, at least a portion of the (111) silicon surface layer 202c is converted to 3C-silicon carbide. In FIG. 17 the entire (111) silicon surface layer 202c is converted to a layer of 3C-silicon carbide 202c', for example in a manner described above. As was described above, the conversion step of FIG. 17 may be omitted.

Figure 18:
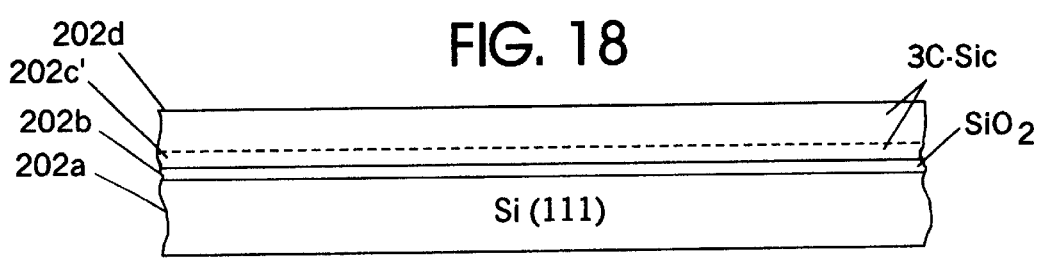
Figure 19:
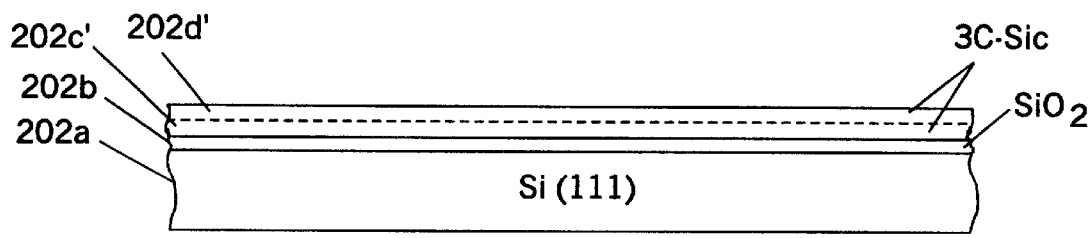

Then, referring to FIG. 18, a layer of 3C-silicon carbide 202d is epitaxially grown on the converted (111) silicon surface layer 202c' or directly on the (111) silicon surface layer 202c in a manner that was described above. As shown in FIG. 19, the epitaxially grown layer of 3C-silicon carbide 202d optionally is thinned to produce a thinned epitaxial layer of 3C-silicon carbide 202d'.

Figure 20:
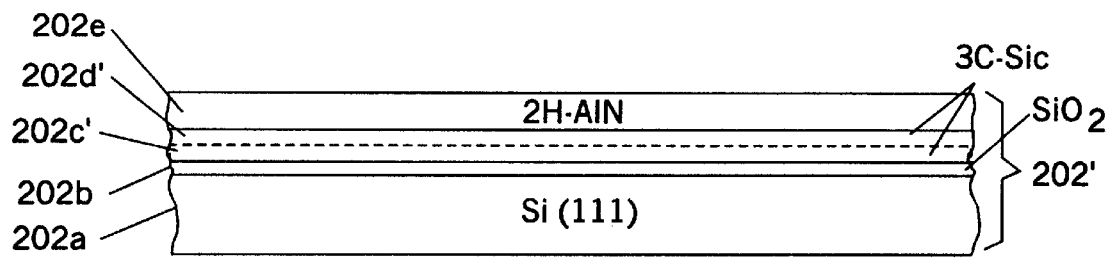
Figure 21:
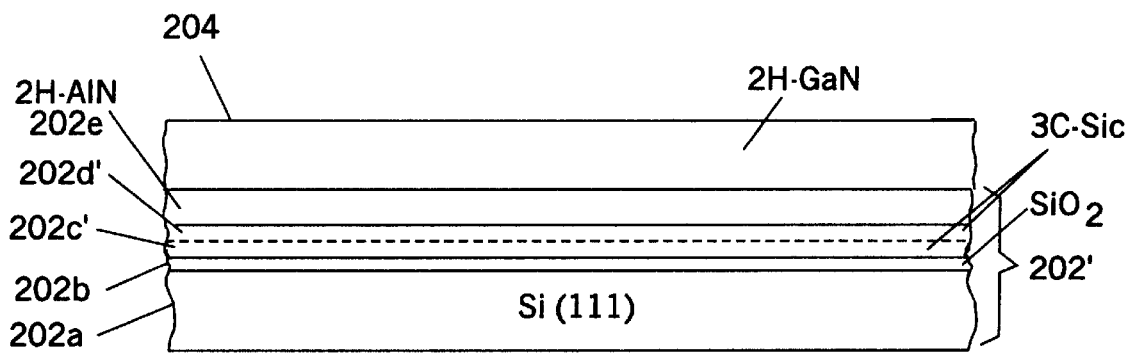

As shown in FIG. 20, a 2H-aluminum nitride layer and/or gallium nitride buffer 202e then is grown on the thinned epitaxially grown layer of 3C-silicon carbide 202d'. Then, as shown in FIG. 21 an underlying layer of 2H-gallium nitride 204 is grown on the buffer layer 202e.

FIGS. 22–26 now will show the use of pendeoepitaxy to laterally grow the underlying layer of 2H-gallium nitride 204 to thereby produce a gallium nitride microelectronic layer. However, it will be understood that epitaxial lateral overgrowth techniques of FIGS. 7–15, and/or other techniques may be used.

Figure 22:
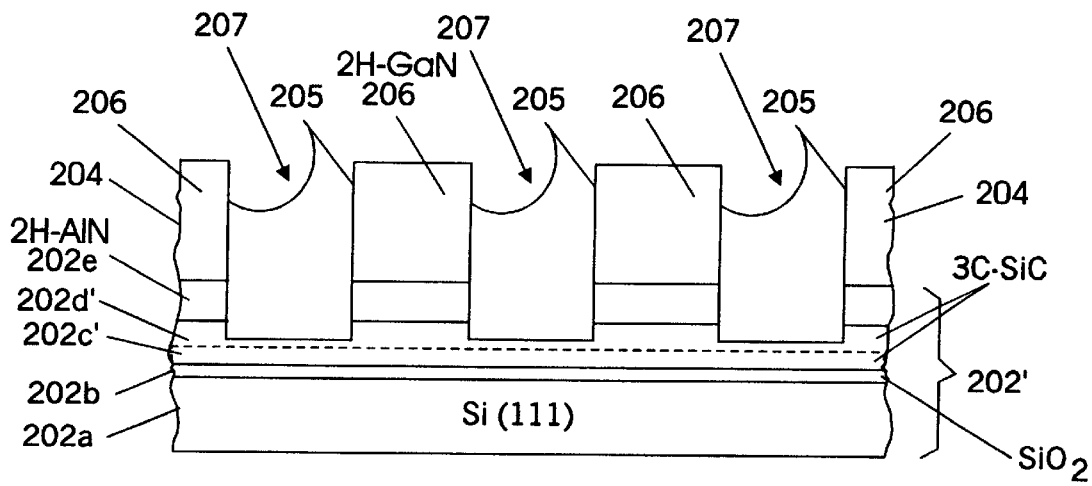

Referring to FIG. 22, the underlying gallium nitride layer 204 includes a plurality of sidewalls 205 therein. It will be understood by those having skill in the art that the sidewalls 205 may be thought of as being defined by a plurality of spaced apart posts 206, that also may be referred to as "mesas", "pedestals" or "columns". The sidewalls 205 also may be thought of as being defined by a plurality of trenches 207, also referred to as "wells" in the underlying gallium nitride layer 204. The sidewalls 205 may also be thought of as being defined by a series of alternating trenches 207 and posts 206. Moreover, a single post 206 may be provided, that may be thought of as being defined by at least one trench 207 adjacent the single post. It will be understood that the posts 206 and the trenches 207 that define the sidewalls 205 may be fabricated by selective etching, selective epitaxial growth and/or other conventional techniques. Moreover, it also will be understood that the sidewalls need not be orthogonal to the substrate 202, but rather may be oblique thereto. Finally, it also will be understood that although the sidewalls 205 are shown in cross-section in FIG. 22, the posts 206 and trenches 207 may define elongated regions that are straight, V-shaped or have other shapes. As shown in FIG. 22, the trenches 207 may extend into the buffer layer 202e and into the silicon carbide layer 202c'/202d', so that subsequent gallium nitride growth occurs preferentially on the sidewalls 205 rather than on the trench floors. In other embodiments, the trenches may not extend into the silicon carbide layer 202c'/202d', and also may not extend into buffer layer 202e, depending, for example, on the trench geometry and the lateral versus vertical growth rates of the gallium nitride.

Figure 23:
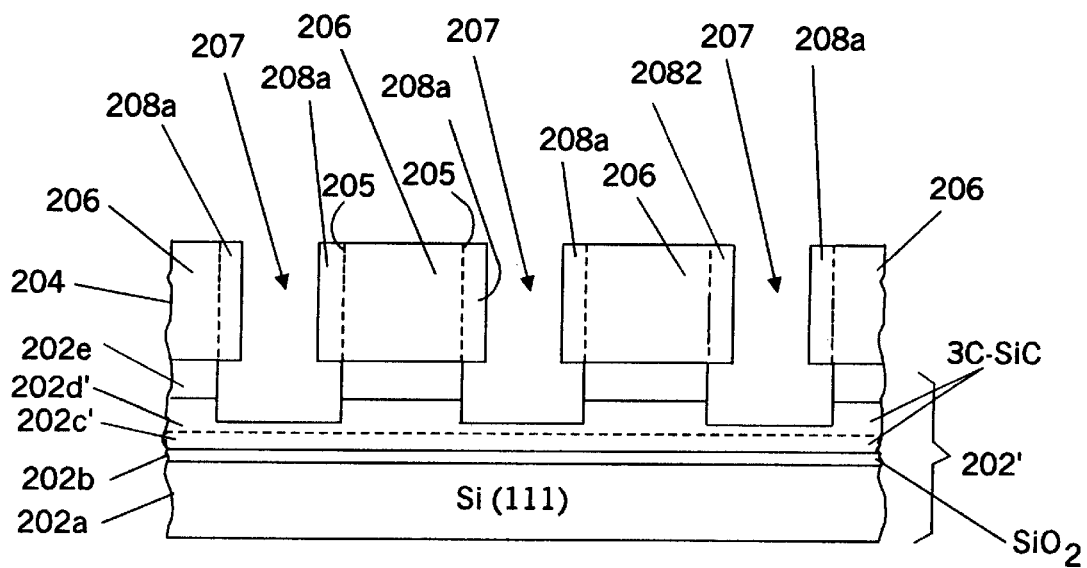

Referring now to FIG. 23, the sidewalls 205 of the underlying gallium nitride layer 204 are laterally grown to form a lateral gallium nitride layer 208a in the trenches 207. Lateral growth of gallium nitride may be obtained at 1000–1100° C. and 45 Torr. The precursors TEG at 13–39 μmol/min and $NH_3$ at 1500 sccm may be used in combination with a 3000 sccm $H_2$ diluent. If gallium nitride alloys are formed, additional conventional precursors of aluminum or indium, for example, may also be used. As used herein, the term "lateral" means a direction that is orthogonal to the sidewalls 205. It will also be understood that some vertical growth on the posts 206 may also take place during the lateral growth from sidewalls 205. As used herein, the term "vertical" denotes a directional parallel to the sidewalls 205.

Figure 24:
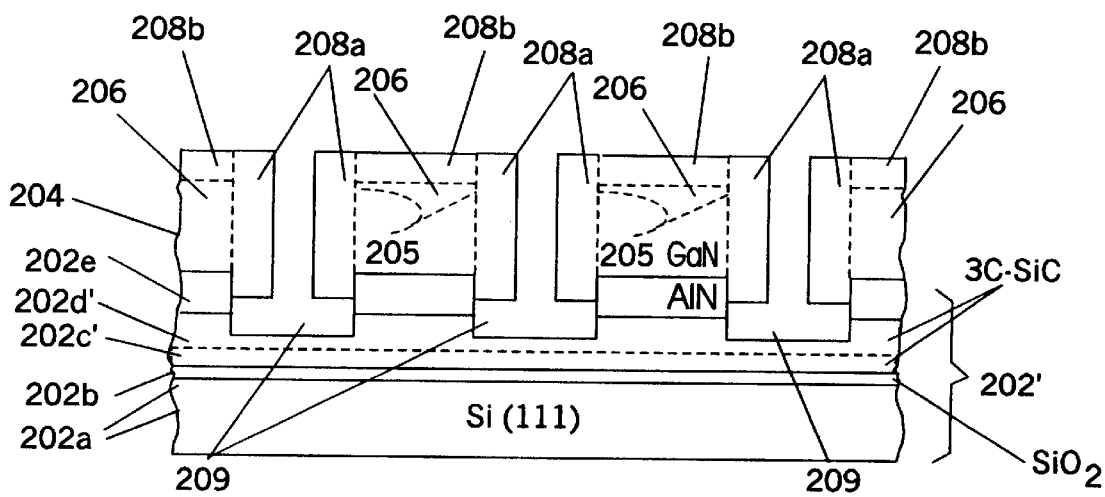

Referring now to FIG. 24, continued growth of the lateral gallium nitride layer 208a causes vertical growth onto the underlying gallium nitride layer 204, specifically onto the posts 206, to form a vertical gallium nitride layer 208b.

Growth conditions for vertical growth may be maintained as was described in connection with FIG. 23. As also shown in FIG. 24, continued vertical growth into trenches 207 may take place at the bottom of the trenches.

Figure 25:
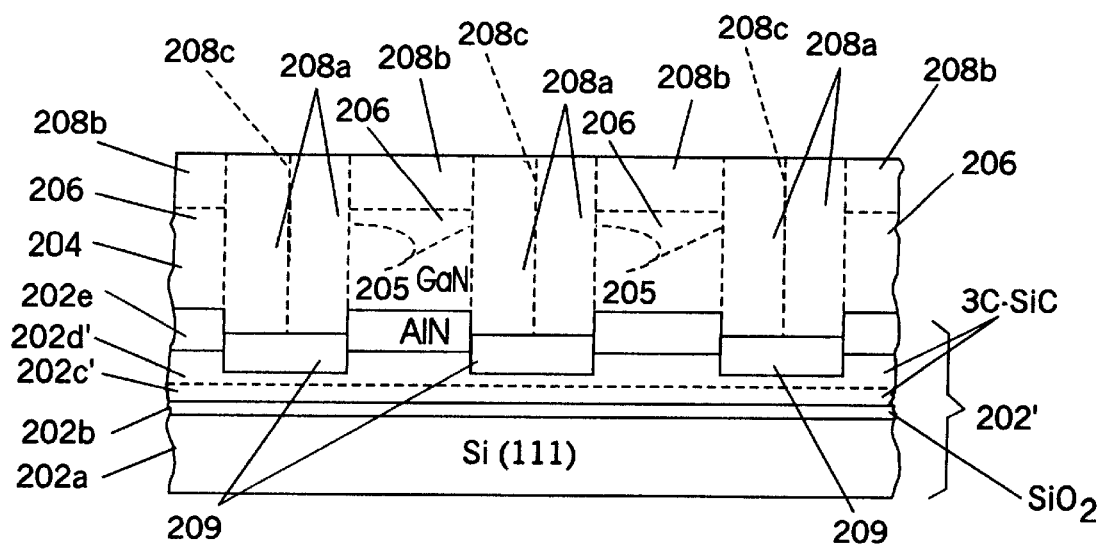
Figure 26:
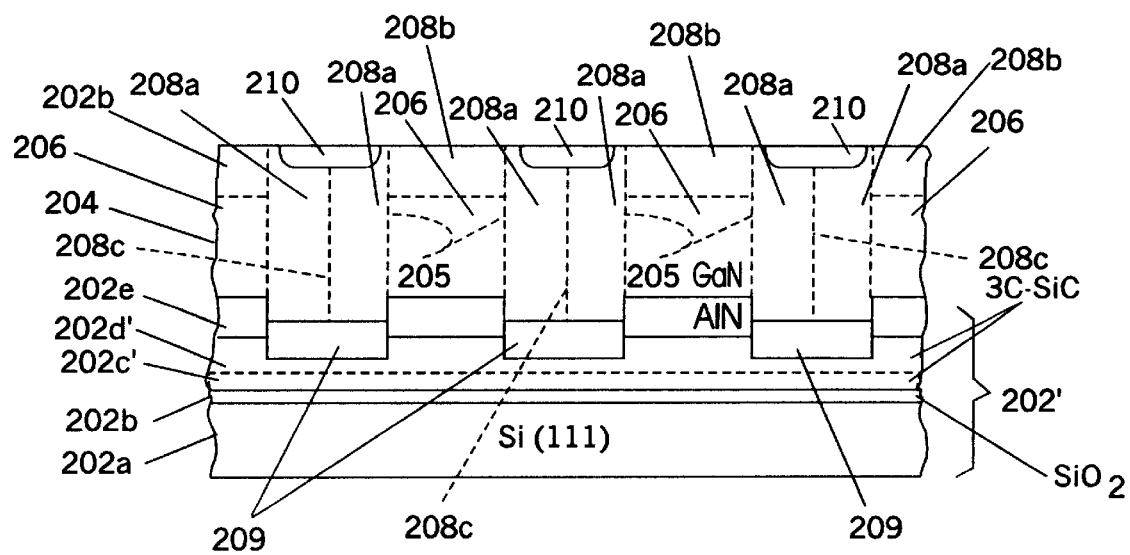

Referring now to FIG. 25, growth is allowed to continue until the lateral growth fronts coalesce in the trenches 207 at the interfaces 208c, to form a continuous gallium nitride semiconductor layer in the trenches. The total growth time may be approximately 60 minutes. As shown in FIG. 26, microelectronic devices 210 may then be formed in the lateral gallium nitride semiconductor layer 208a. Devices also may be formed in vertical gallium nitride layer 208b.

It will be understood that in the embodiments of FIGS. 16–26, a mask need not be used to fabricate the gallium nitride semiconductor structures because lateral growth is directed from the sidewalls 205. However, as will be described in connection with FIGS. 27–41, a mask may be used. It also will be understood by those having skill in the art that in order to obtain a continuous gallium nitride layer of low crystallographic defects an epitaxial lateral overgrowth then may be performed on the structure of FIG. 26 using a mask as was described in connection with FIGS. 7–15. Laterally offset masks also may be used. Moreover, a second, laterally offset pendeoepitaxial process may be performed on the structure of FIG. 26 by defining second trenches and/or posts. By performing two separate lateral growths, the defect density may be reduced considerably.

As was described in connection with FIGS. 16–26, a silicon substrate containing a buried oxide layer such as a SIMOX wafer 202 is used. The use of a SIMOX wafer can prevent or limit warping of the substrate after formation of silicon carbide layers 202c'/202d'. In particular, when the structures are cooled after silicon carbide formation from growth temperatures to room temperature, the structures may warp due to the large mismatches in the coefficients of thermal expansion between silicon and silicon carbide. This effect may be more pronounced when using large diameter silicon wafers. To reduce this effect, using wafers with layers of oxide 202b may prevent or reduce the warping by acting as a compliant substrate. At the elevated temperatures used in silicon carbide formation, the oxide may undergo viscous flow and accommodate the mismatches in both the lattice parameters and the coefficient of thermal expansion between the silicon and the silicon carbide layers. On cooling, the oxide layer may then provide a mechanism of strain relief and limit the warping of the substrate.

Moreover, as described above, the silicon carbide 202c'/202d' is a preferred material template on which to grow the aluminum nitride buffer layer 202e and the gallium nitride semiconductor layers 204. Pendeoepitaxial growth of gallium nitride may be obtained on silicon carbide, because under the growth conditions used for pendeoepitaxial growth, gallium and nitrogen atoms generally will not bond to the silicon carbide surface in numbers and in time sufficient to cause gallium nitride nuclei to form. Finally, as described above, the silicon carbide layer may provide a diffusion barrier to prevent the interaction of silicon atoms with gallium and nitrogen species found in the growth environment.

Referring now to FIGS. 27–41, third embodiments according to the present invention now will be described. These embodiments use a Semiconductor-On-Insulator (SOI) substrate as a platform for growth of gallium nitride microelectronic layers. As will be described in detail below, these embodiments may be particularly useful for integration of electronic devices such as conventional CMOS devices and optoelectronic devices such as gallium nitride lasers and/or LEDs.

Figure 27:
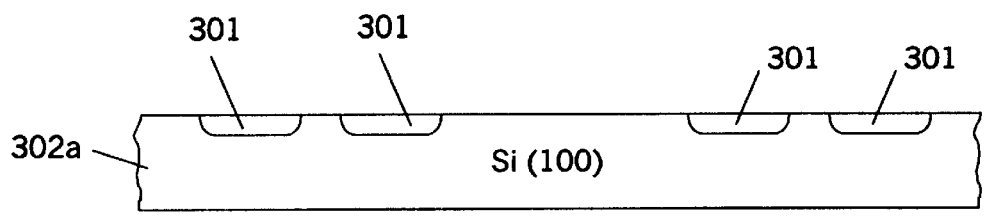
FIGS. 27–41 are cross-sectional views of third gallium nitride microelectronic structures during intermediate fabrication steps, according to the present invention.

Referring now to FIG. 27, a plurality of microelectronic devices 301, including but not limited conventional CMOS devices, are fabricated in a (100) silicon substrate 302a using conventional techniques. It will be understood that the devices 301 may be formed later as well, as will be described in detail below. It also will be understood that microelectronic devices 301 may include optical and/or microelectromechanical (MEMS) devices as well.

Figure 28:
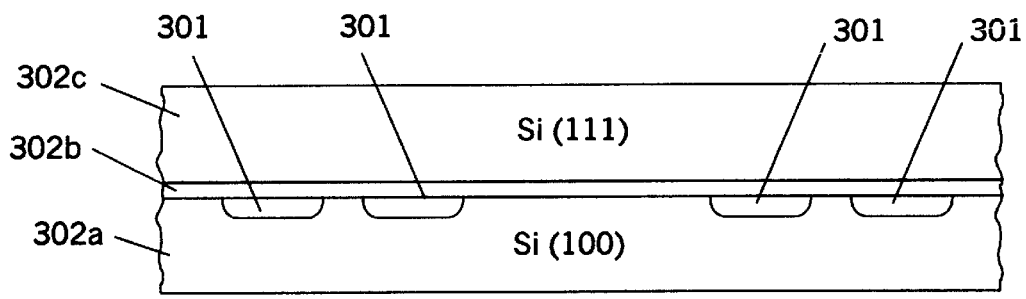
Figure 29:
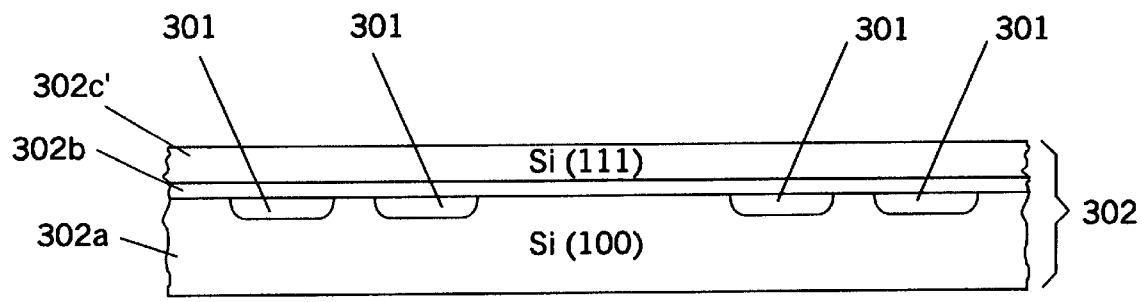

Referring to FIG. 28, the (100) silicon substrate 302a then is bonded to a (111) silicon substrate 302c using a bonding layer 302b and conventional bonding techniques. The bonding layer may be a microelectronic epoxy, a layer of silicon dioxide and/or other conventional materials. Then referring to FIG. 29, the (111) silicon substrate 302c is thinned to produce a (111) silicon layer 302c' on the (100) silicon substrate 302a. The operations of FIGS. 27–29 may form a conventional silicon on insulator (SOI) substrate 302 except that microelectronic devices 301 are contained therein.

Figure 30:
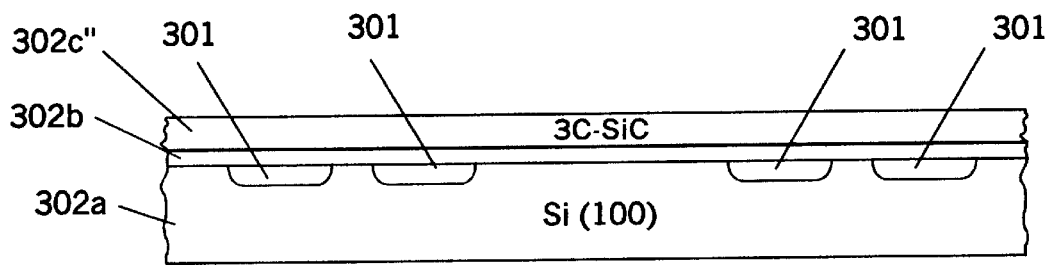
Figure 31:
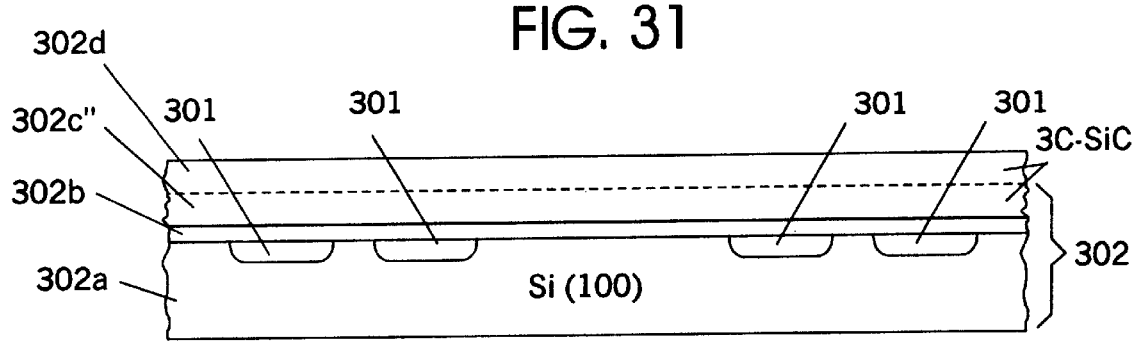
Figure 32:
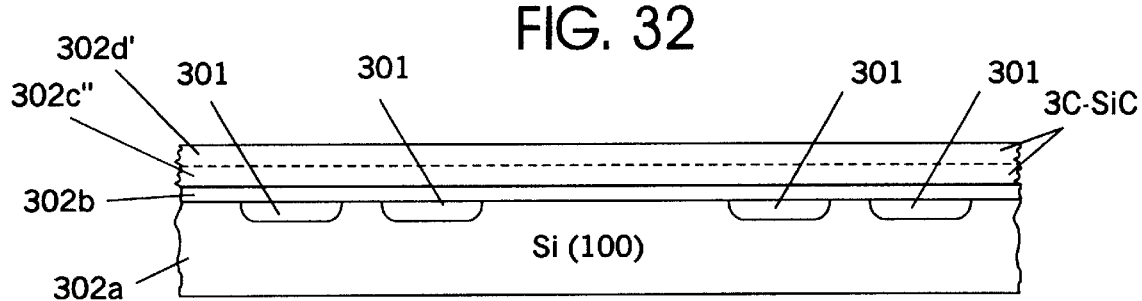
Figure 33:
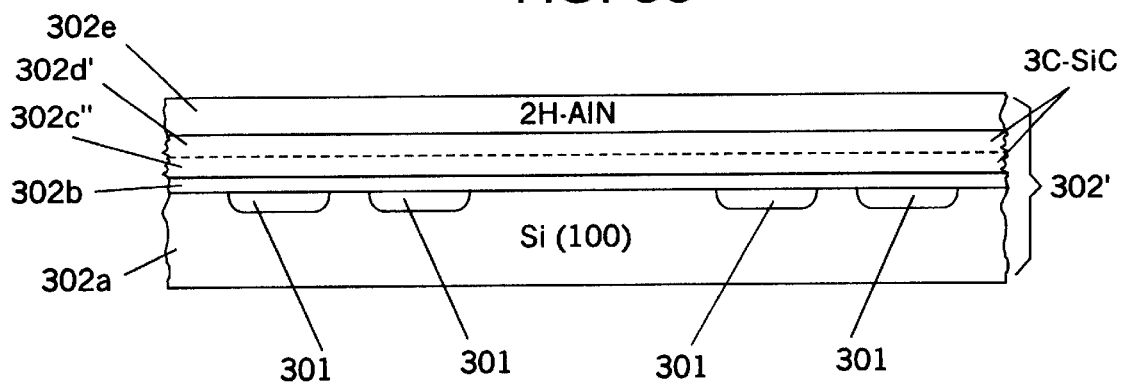
Figure 34:
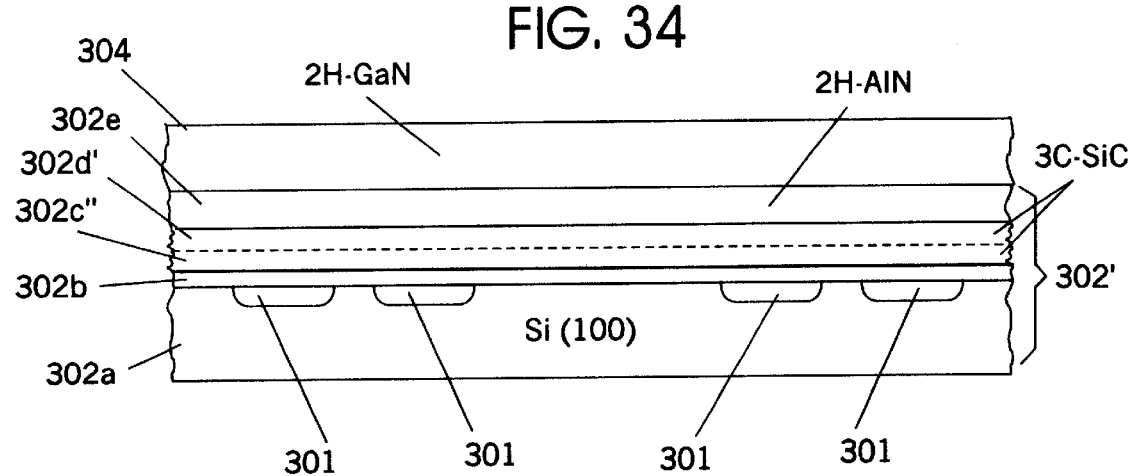

Referring now to FIG. 30, at least part of the (111) silicon layer 302c' is converted to 3C-silicon carbide layer 302c". As shown in FIG. 30, all of the layer 302c' is converted to silicon carbide layer 302c". Moreover, as was described above, the conversion step may be eliminated. Then, as shown in FIG. 31, a layer of 3C-silicon carbide 302d may be epitaxially grown on the converted (111) silicon layer 302c". Optionally, as shown in FIG. 32, the epitaxially grown layer of 3C-silicon carbide 302d is thinned to produce thinned layer 302d'. An aluminum nitride layer 302e then is grown on a thinned epitaxially grown layer of 3C-silicon carbide 302d'. This provides a platform 302' for subsequent growth of gallium nitride. As shown in FIG. 34, a layer of 2H-gallium nitride 304 is grown on the aluminum nitride layer 302e.

In FIGS. 35–39, masked pendeoepitaxy is performed to laterally grow the layer of 2H-gallium nitride 304 to produce a gallium nitride microelectronic layer. However, it will be understood that maskless pendeoepitaxy, epitaxial lateral growth, other techniques and/or combinations thereof also may be used.

Figure 35:
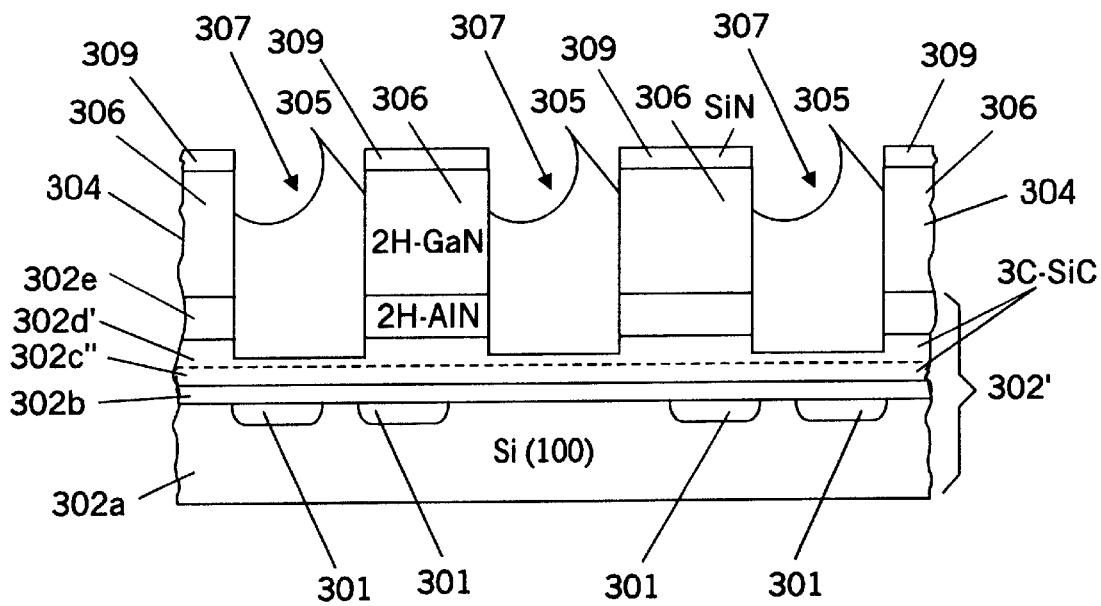

Referring now to FIG. 35, a mask such as silicon nitride mask 309 is provided on the underlying gallium nitride layer 304. The mask 309 may have a thickness of about 1000 Ångstroms and may be formed on the underlying gallium nitride layer 304 using low pressure chemical vapor deposition (CVD) at 410° C.

Still referring to FIG. 35, the underlying gallium nitride layer 304 includes a plurality of sidewalls 105 therein. As already described, it will be understood by those having skill in the art that the sidewalls 305 may be thought of as being defined by a plurality of spaced apart posts 306, that also may be referred to as "mesas", "pedestals" or "columns". The sidewalls 305 may also be thought of as being defined by a plurality of trenches 307, also referred to as "wells" in the underlying gallium nitride layer 304. The sidewalls 305 may also be thought of as being defined by a series of alternating trenches 307 and posts 306. It will be understood that the posts 306 and the trenches 307 that define the sidewalls 305 may be fabricated by selective etching, selective epitaxial growth and/or other conventional techniques. Moreover, it also will be understood that the sidewalls need not be orthogonal to the substrate 302, but rather may be oblique thereto. Finally, it will also be understood that although the sidewalls 305 are shown in cross-section in FIG. 35, the posts 306 and trenches 307 may define elongated regions that are straight, V-shaped or have other shapes. As shown in FIG. 35, the trenches 307 preferably extend into the buffer layer 302e and into the silicon carbide layer 302d'/302c", so that subsequent gallium nitride growth occurs preferentially on the sidewalls 305 rather than on the trench floors. In other embodiments, the trenches may not extend into the silicon carbide layer 302d'/302c", and also may not extend into the buffer layer 302e.

Figure 36:
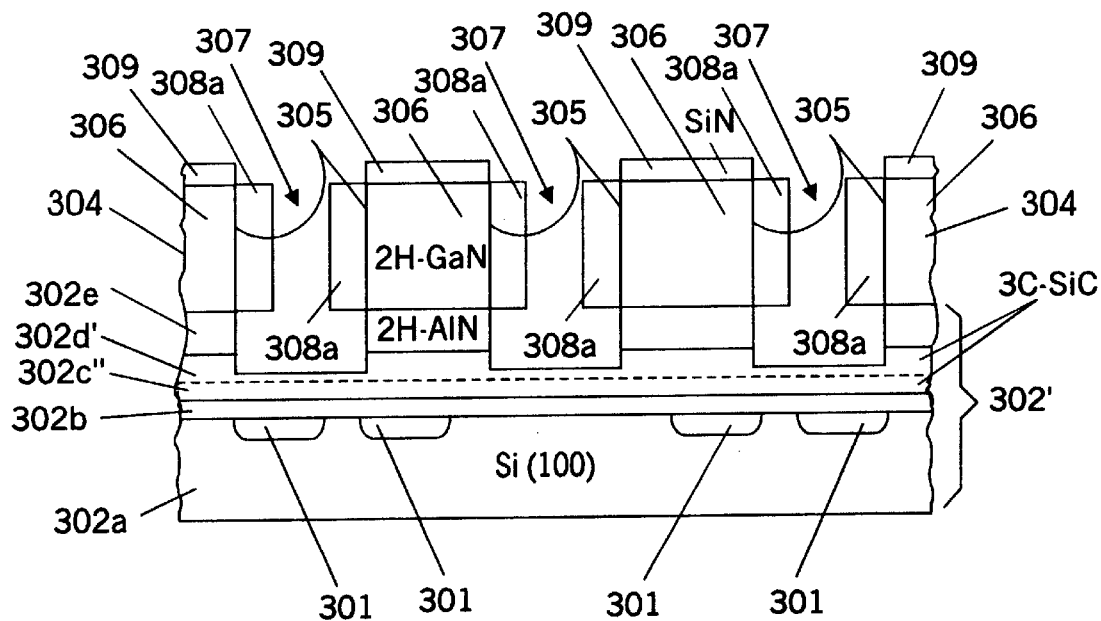

Referring now to FIG. 36, the sidewalls 305 of the underlying gallium nitride layer 304 are laterally grown to form a lateral gallium nitride layer 308a in the trenches 307. Lateral growth of gallium nitride may be obtained at about 1000–1100° C. and about 45 Torr. The precursors TEG at about 13–39 μmol/min and $NH_3$ at about 1500 sccm may be used in combination with about 3000 sccm $H_2$ diluent. If gallium nitride alloys are formed, additional conventional precursors of aluminum or indium, for example, also may be used. As used herein, the term "lateral" means a direction that is parallel to the faces of the substrate 302'. It will also be understood that some vertical growth of the lateral gallium nitride 308a may also take place during the lateral growth from the sidewalls 305. As used herein, the term "vertical" denotes a directional parallel to the sidewalls 305.

Figure 37:
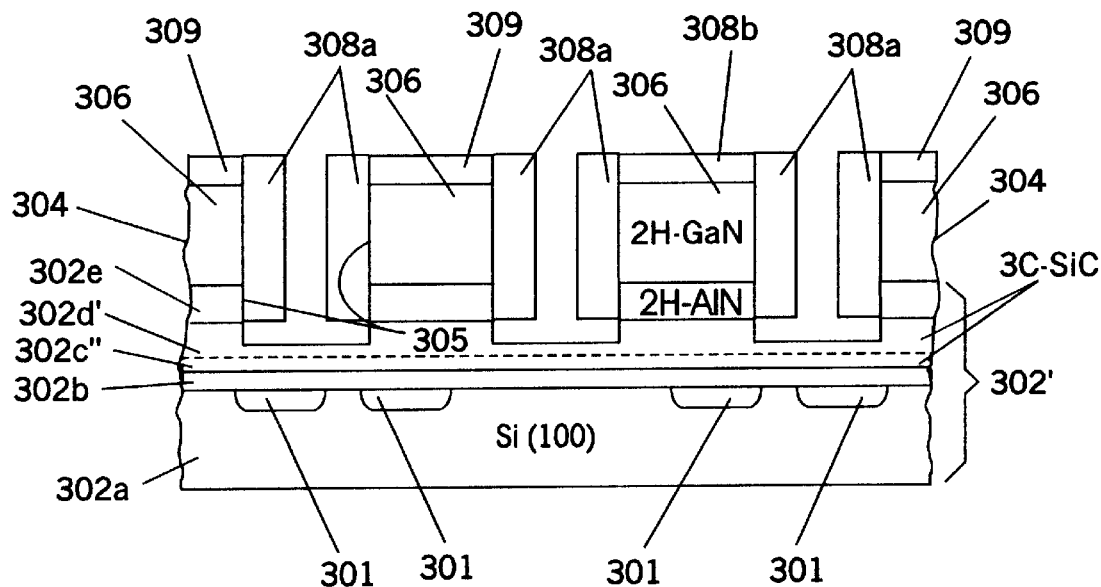

Referring now to FIG. 37, continued growth of the lateral gallium nitride layer 308a causes vertical growth of the lateral gallium nitride layer 308a. Conditions for vertical growth may be maintained as was described above. As also shown in FIG. 37, continued vertical growth into trenches 307 may take place at the bottom of the trenches.

Figure 38:
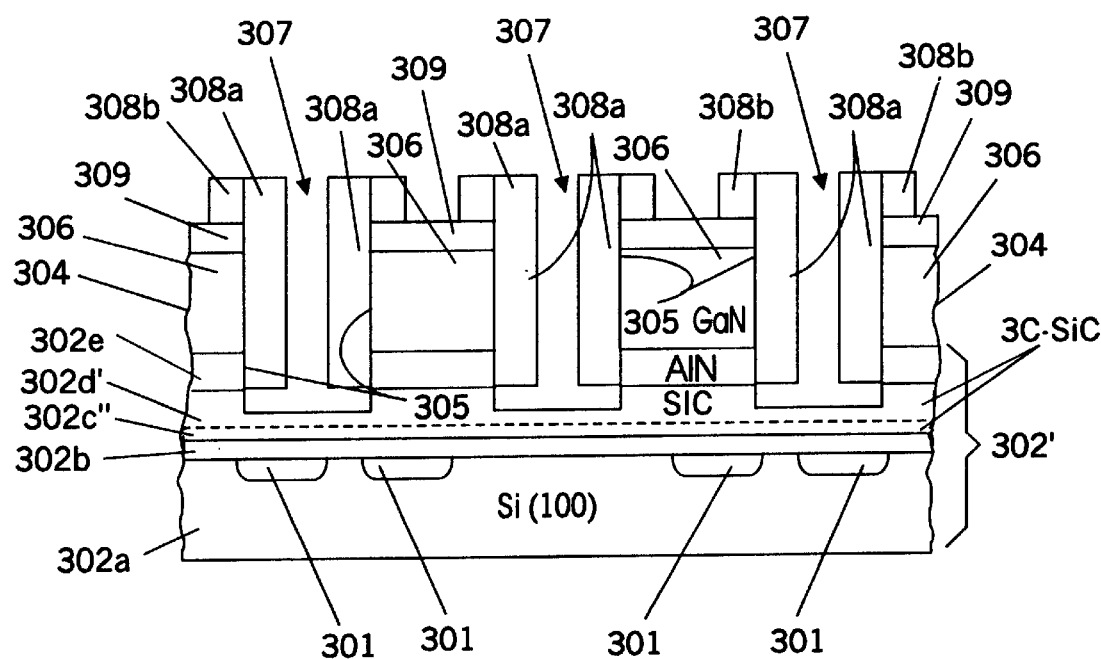

Referring now to FIG. 38, continued growth of the lateral gallium nitride layer 308a causes lateral overgrowth onto the mask 309, to form lateral overgrowth gallium nitride layer 308b. Growth conditions for overgrowth may be maintained as was described above.

Figure 39:
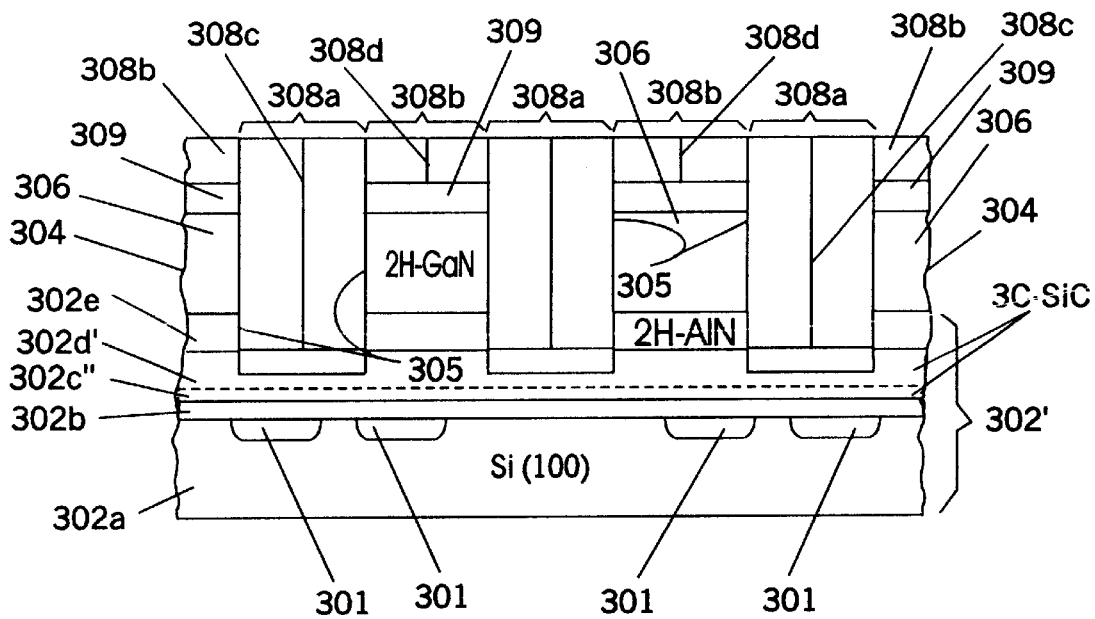

Referring now to FIG. 39, growth is allowed to continue until the lateral growth fronts coalesce in the trenches 307 at the interfaces 308c, to form a continuous gallium nitride semiconductor layer in the trenches.

Figure 40:
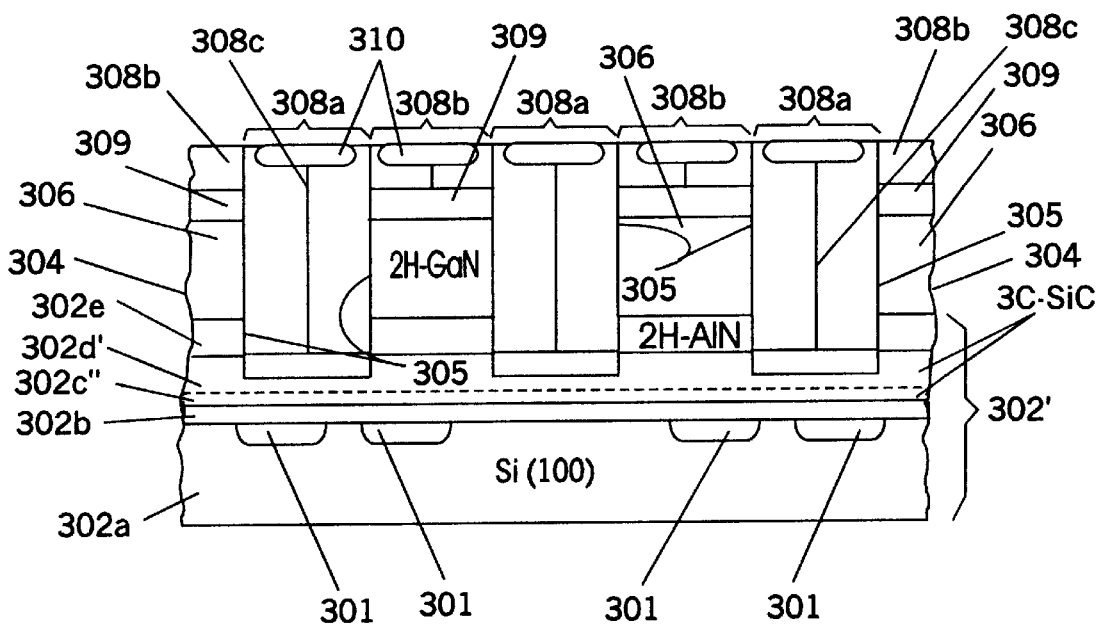

Still referring to FIG. 39, growth is allowed to continue until the lateral overgrowth fronts coalesce over the mask 309 at the interfaces 308d, to form a continuous gallium nitride semiconductor layer. The total growth time may be approximately 60 minutes. As shown in FIG. 40, microelectronic devices 310 may then be formed in the lateral gallium nitride semiconductor layer 308a. Devices may also be formed in lateral overgrown gallium nitride layer 308b.

Figure 41:
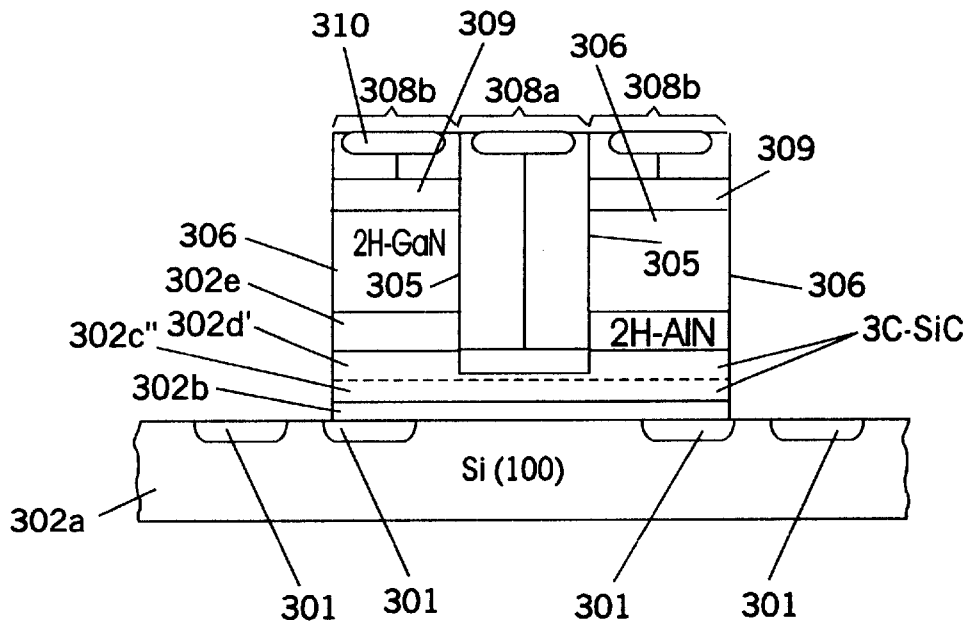

Then referring to FIG. 41, at least a portion of the 3C-silicon carbide layer 102c"/102d', the aluminum nitride layer 302e, the gallium nitride layer 304 and the microelectronic layer 308 are removed to expose the microelectronic devices 301 in the (100) silicon substrate. The microelectronic devices 301 in the (100) silicon substrate then may be electrically connected to the microelectronic devices 310 in the pendeoepitaxial gallium nitride layer to provide an integrated optical and electronic substrate. The connection may use conventional metallization soldering and/or other techniques. Accordingly, high density integrated optoelectronic devices may be formed using conventional (100) silicon SOI substrates.

As was described in connection with the embodiment of FIGS. 16–26, the silicon carbide layer 302d'/302c" may be critical to the success of forming gallium nitride structures because the silicon carbide is a preferred material template on which to grow the aluminum nitride layer 302e and the gallium nitride semiconductor layer 304. Moreover, under the growth conditions used for pendeoepitaxial growth, gallium and nitrogen atoms generally will not bond to the silicon carbide surface in numbers and times sufficient to cause gallium nitride nuclei to form. Alternatively, it will be understood that the bottom of the trenches 307 may be masked, for example with silicon nitride. The silicon carbide layer also may provide a diffusion barrier to prevent the interaction of silicon atoms with gallium and nitrogen species found in the growth environment.

Moreover, as was described above, the SOI wafers can prevent or limit warping of the substrate after silicon carbide formation. In particular, the bonding layer 302b may prevent or limit the warping by acting as a compliant substrate. On cooling, the bonding layer 302b may also provide a mechanism of strain relief and may limit the warping of the substrate.

Figure 42:
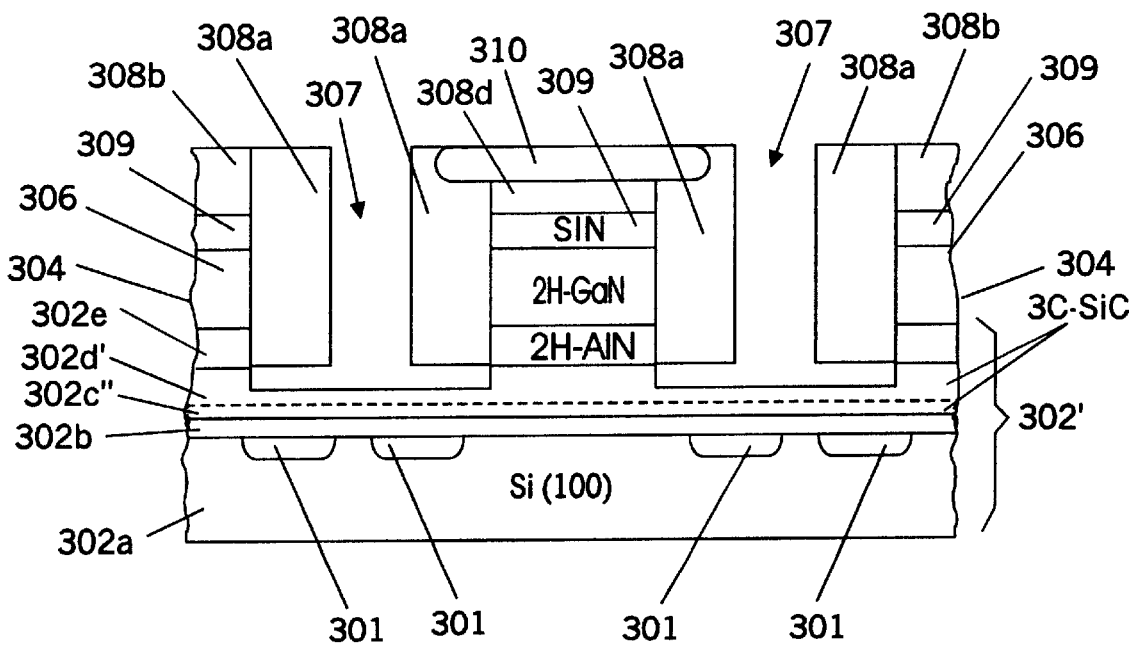
FIGS. 42–43 are cross-sectional views of fourth gallium nitride microelectronic structures during intermediate fabrication steps, according to the present invention.
Figure 43:
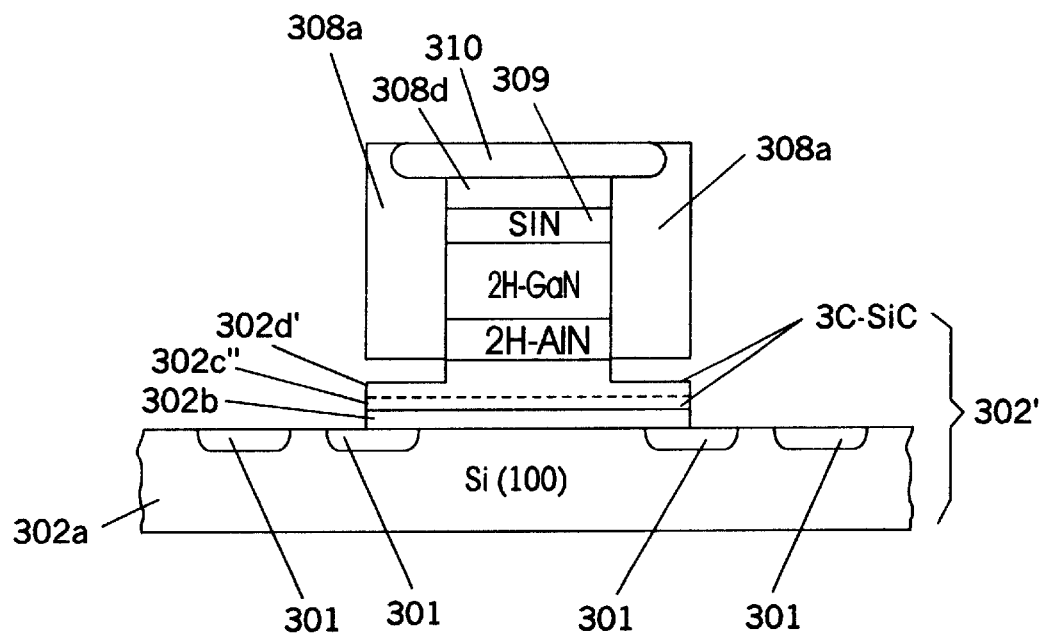

Referring now to FIGS. 42–45, other embodiments of gallium nitride semiconductor structures and fabrication methods according to the present invention will now be described. The structures use different spacings or dimensions for the posts and trenches. In FIGS. 42 and 43, a small post-width/trench width ratio is used. Thus, discreet gallium nitride structures shown in FIG. 42 may be obtained. In another embodiment, a large post-width/trench-width ratio is used so that gallium nitride structures shown in FIG. 44 may be obtained.

Referring now to FIG. 42, using a small post-width/trench-width ratio, gallium nitride semiconductor structures of FIG. 42 are fabricated as was already described. Still referring to FIG. 42, growth is allowed to continue until the lateral overgrowth fronts coalesce over the mask 309 at the interface 308b to form a continuous gallium nitride semiconductor layer over the mask 309. The total growth time may be approximately 60 minutes. As shown in FIG. 42, microelectronic devices 310 may be formed in the lateral overgrowth gallium nitride layer 308d. Then, as shown in FIG. 43, at least some of the discreet gallium nitride structures are removed to expose the microelectronic devices 301 in the (100) silicon substrate 302a.

Figure 44:
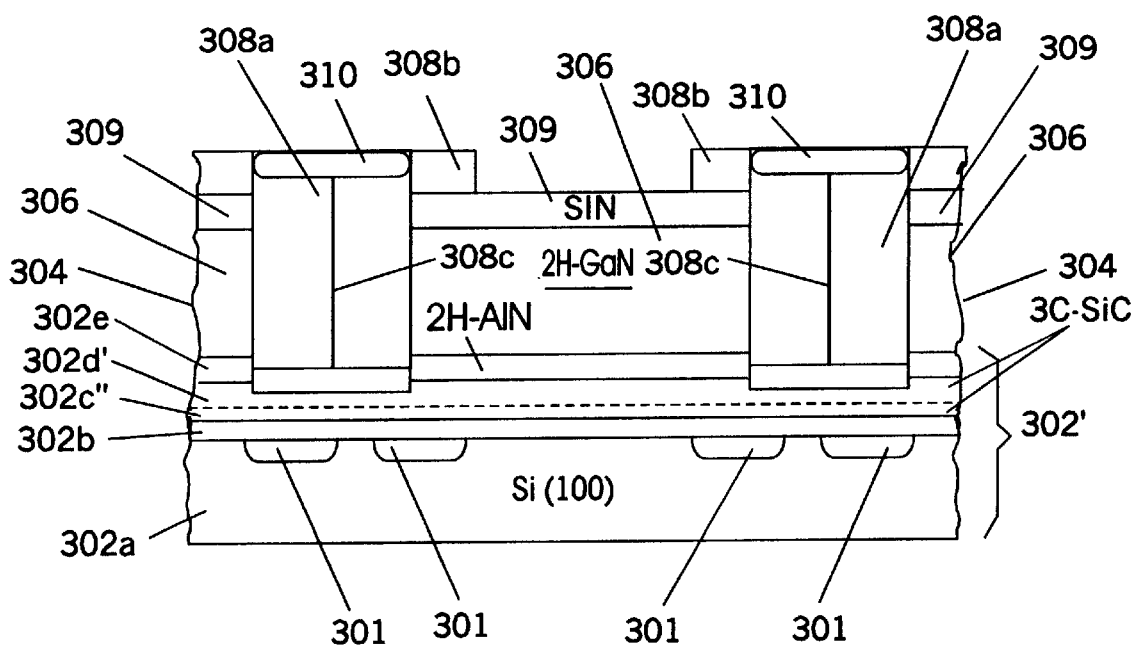
FIGS. 44–45 are cross-sectional views of fifth gallium nitride microelectronic structures during intermediate fabrication steps, according to the present invention.
Figure 45:
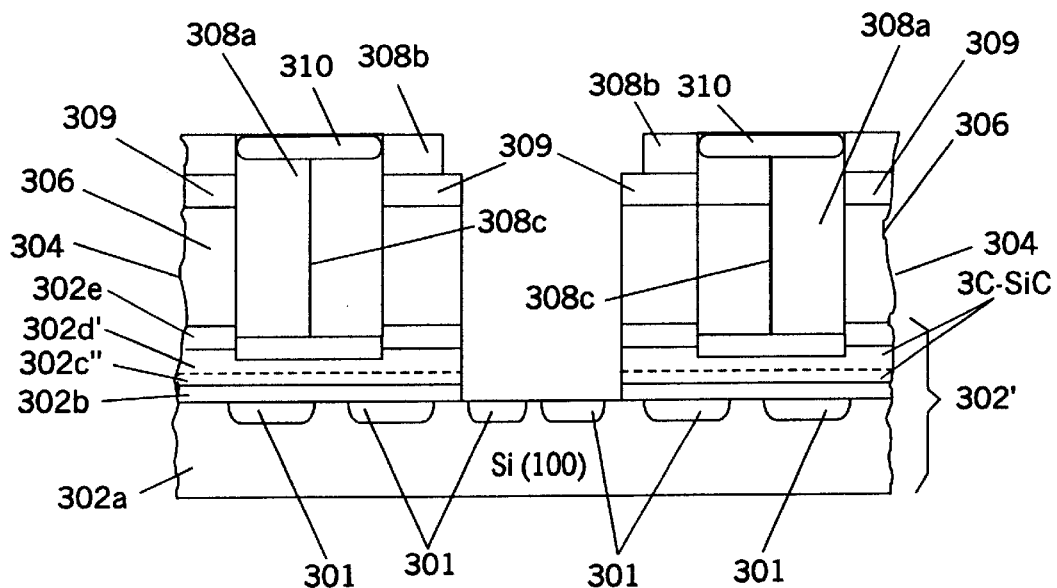

Referring now to FIG. 44, using a large post-width/trench-width ratio, gallium nitride semiconductors structures of FIG. 44 are fabricated as was already described. Still referring to FIG. 44, growth is allowed to continue until the lateral overgrowth fronts coalesce in the trench 307 at the interfaces 308c to form a continuous gallium nitride semiconductor layer 308a over the trench 307. The total growth time may be approximately 60 minutes. As shown in FIG. 44, microelectronic devices 310 may be formed in the pendeoepitaxial gallium nitride layer 308a. Then, as shown in FIG. 45, at least a portion of the gallium nitride structure may be removed to thereby expose the underlying microelectronic devices 301, and was described above.

In the above-described embodiments, devices 301 are formed in the (100) silicon substrate 302a prior to forming the gallium nitride devices 310. However, it will be understood that gallium nitride fabrication processes may occur at temperatures that are sufficiently high to destroy or degrade performance of the silicon devices 301 due to diffusion or other thermal effects. Accordingly, it may be desirable to form the microelectronic devices 301 in the (100) silicon substrate 302a after forming the gallium nitride layers and structures.

Figure 46:
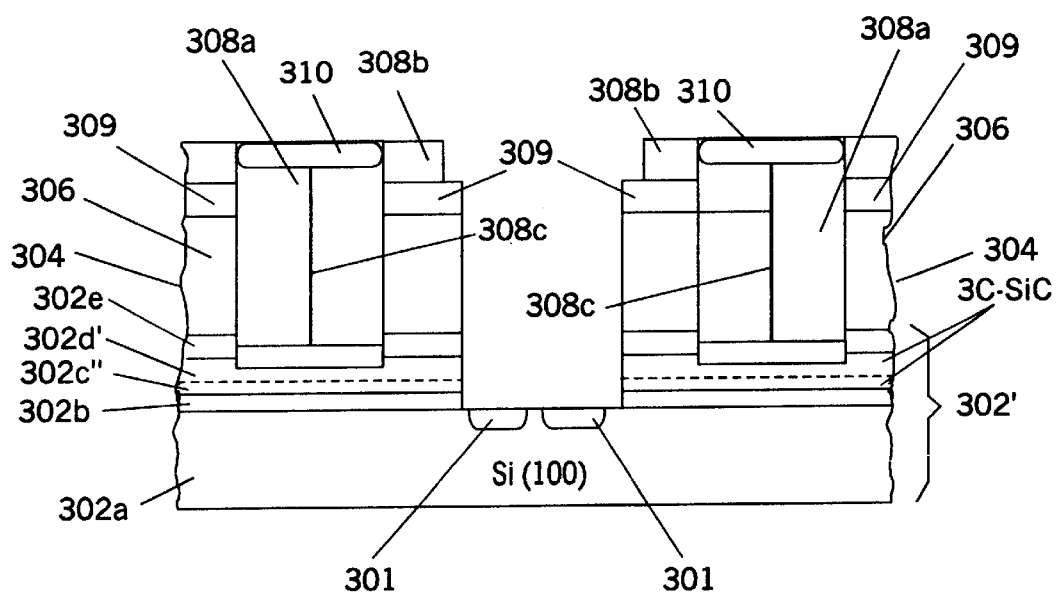
FIG. 46 is a cross-sectional view of sixth gallium nitride microelectronic structures according to the present invention.

FIGS. 46–49 illustrate methods of forming microelectronic devices in the (100) silicon substrate after forming the gallium nitride layers and structures. In particular, as shown in FIG. 46, the structure of FIG. 45 may be fabricated except that microelectronic devices 301 are not formed until after the gallium nitride structures are formed. Thus, as shown in FIG. 46, upon removal of at least some of the gallium nitride structures, the face of the (100) silicon substrate 302a is exposed, and conventional microelectronic devices 301 may be formed in the exposed surface.

It may be difficult to fabricate the microelectronic devices 301 within the trenches between the gallium nitride devices. The embodiments of FIGS. 47–49 illustrate alternative fabrication techniques that need not fabricate the silicon microelectronic devices 301 at the bottom of the trenches.

Figure 47:
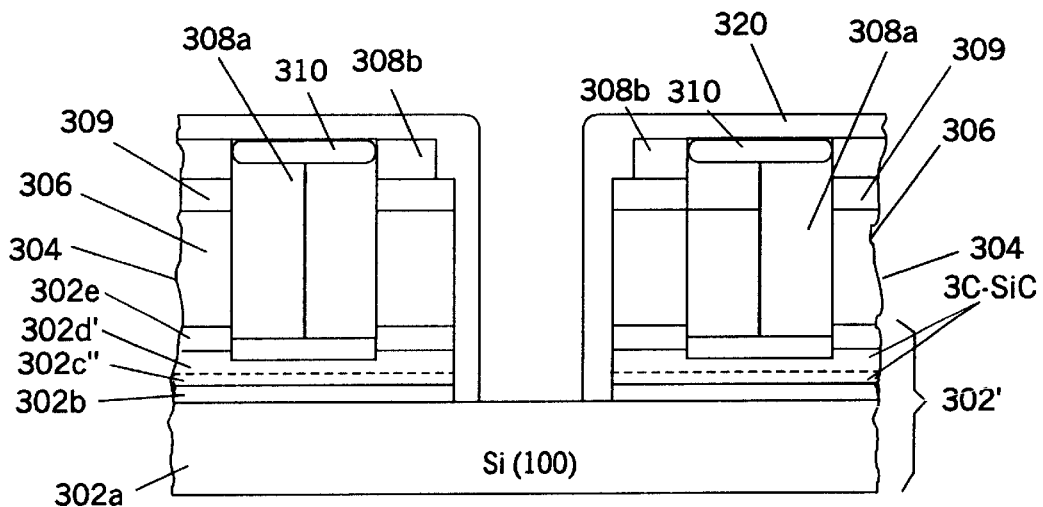
FIGS. 47–49 are cross-sectional views of seventh gallium nitride microelectronic structures during intermediate fabrication steps, according to the present invention.
Figure 48:
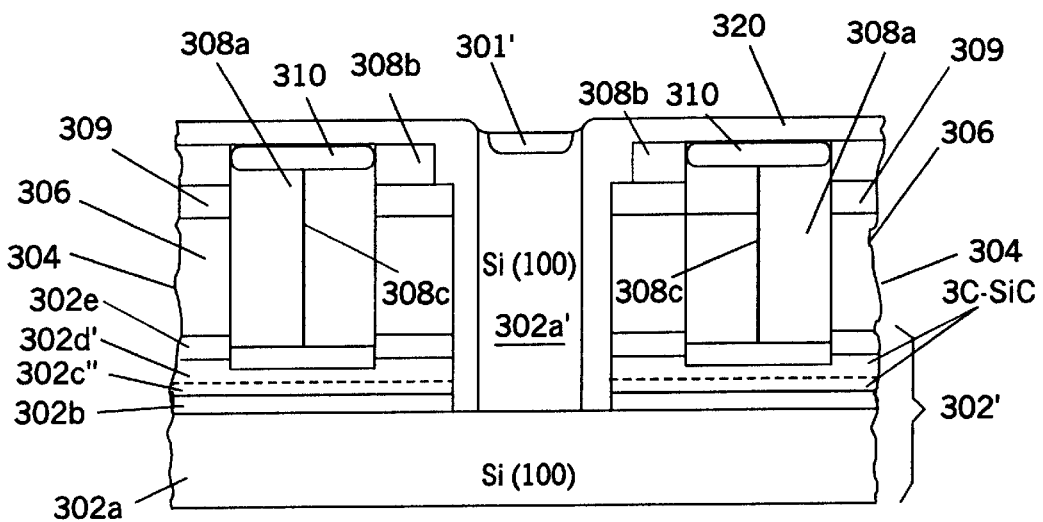

In particular, referring to FIG. 47, the device of FIG. 45 is fabricated except that microelectronic devices 301 are not fabricated in the (100) silicon substrate 302a. A capping layer 320, for example silicon dioxide and/or silicon nitride, then is formed on the gallium nitride devices. Then, referring to FIG. 48, the (100) silicon substrate 302a is selectively epitaxially grown to form a (100) silicon layer 302a'. Devices 301' then are formed in the epitaxially grown silicon layer 302a'. Thus, the devices 301' may be formed at the surface of the structure rather than at the floor of a trench.

Figure 49:
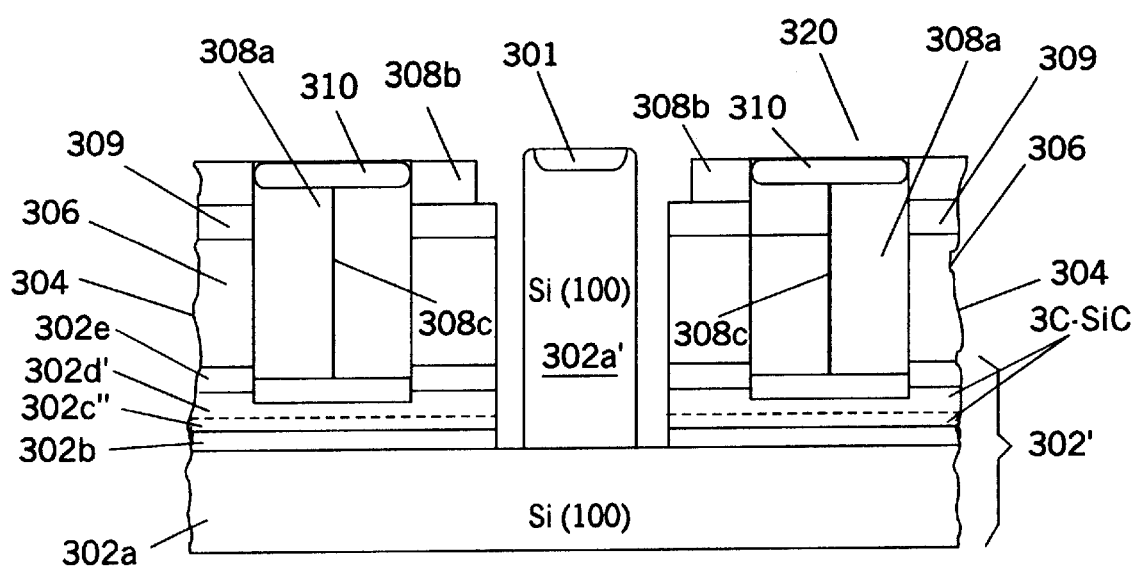

Finally, as shown in FIG. 49, the capping layer 320 optionally may be removed to provide a free-standing silicon layer 302a' that is separated from the gallium nitride-based structures. The devices may be connected using metallization at the top surface. Alternatively, metallization within or on the (100) silicon substrate 302a may be provided.

In the drawings and specification, there have been disclosed typical preferred embodiments of the invention and, although specific terms are employed, they are used in a generic and descriptive sense only and not for purposes of limitation.

What is claimed is:

1. A method of fabricating a gallium nitride microelectronic layer comprising the steps of:
    converting a surface of a (111) silicon layer to 3C-silicon carbide;
    epitaxially growing a layer of 3C-silicon carbide on the converted surface of the (111) silicon layer;
    growing a layer of 2H-gallium nitride on the epitaxially grown layer of 3C-silicon carbide; and
    laterally growing the layer of 2H-gallium nitride to produce the gallium nitride microelectronic layer.

2. A method according to claim 1 wherein the silicon layer is a (111) silicon substrate and wherein the converting step comprises the step of:
    converting a surface of the (111) silicon substrate to 3C-silicon carbide.

3. A method according to claim 1 wherein the step of converting is preceded by the step of:
    implanting oxygen into a (111) silicon substrate to define the (111) layer on the (111) silicon substrate.

4. A method according to claim 1 wherein the step of converting comprises the step of chemically reacting the surface of the (111) silicon layer with a carbon containing precursor to convert the surface of the (111) silicon layer to 3C-silicon carbide.

5. A method according to claim 1 wherein the step of growing is preceded by the step of growing an aluminum nitride and/or gallium nitride layer on the epitaxially grown layer of 3C-silicon carbide, and wherein the step of growing comprises the step of:
    growing a layer of 2H-gallium nitride on the aluminum nitride and/or gallium nitride layer, opposite the epitaxially grown layer of 3C-silicon carbide.

6. A method according to claim 1 wherein the step of laterally growing comprises the steps of:
    forming a mask on the layer of 2H-gallium nitride, the mask including at least one opening that exposes the layer of 2H-gallium nitride; and
    laterally growing the layer of 2H-gallium nitride through the at least one opening and onto the mask.

7. A method according to claim 1 wherein the step of laterally growing comprises the steps of:
    forming at least one trench in the layer of 2H-gallium nitride that defines at least one sidewall in the layer of 2H-gallium nitride; and
    laterally growing the layer of 2H-gallium nitride from the at least one sidewall.

8. A method according to claim 1 wherein the step of laterally growing comprises the steps of:
    forming at least one post in the layer of 2H-gallium nitride that defines at least one sidewall in the layer of 2H-gallium nitride; and
    laterally growing the layer of 2H-gallium nitride from the at least one sidewall.

9. A method according to claim 1 wherein the step of laterally growing comprises the steps of:
    forming at least one post in the layer of 2H-gallium nitride that defines at least one sidewall in the layer of 2H-gallium nitride; and
    laterally growing the layer of 2H-gallium nitride from the at least one sidewall.

10. A method of fabricating a gallium nitride microelectronic layer comprising the steps of:
    converting a surface of a (111) silicon substrate to 3C-silicon carbide;
    epitaxially growing a layer of 3C-silicon carbide on the converted surface of the (111) silicon substrate;
    growing a buffer layer on the epitaxially grown layer of 3C-silicon carbide;
    growing a layer of 2H-gallium nitride on the buffer layer; and
    laterally growing the layer of 2H-gallium nitride to produce the gallium nitride microelectronic layer.

11. A method according to claim 10 wherein the step of converting comprises the step of chemically reacting the surface of the (111) silicon substrate with a carbon containing precursor to convert the surface of the (111) silicon substrate to 3C-silicon carbide.

12. A method according to claim 10 wherein the step of laterally growing comprises the steps of:
    forming a mask on the layer of 2H-gallium nitride, the mask including at least one opening that exposes the layer of 2H-gallium nitride; and
    laterally growing the layer of 2H-gallium nitride through the at least one opening and onto the mask.

13. A method according to claim 10 wherein the step of laterally growing comprises the steps of:
    forming at least one trench in the layer of 2H-gallium nitride that defines at least one sidewall in the layer of 2H-gallium nitride; and
    laterally growing the layer of 2H-gallium nitride from the at least one sidewall.

14. A method according to claim 10 wherein the step of laterally growing comprises the steps of:
    forming at least one post in the layer of 2H-gallium nitride that defines at least one sidewall in the layer of 2H-gallium nitride; and laterally growing the layer of 2H-gallium nitride from the at least one sidewall.

15. A method of fabricating a gallium nitride microelectronic layer comprising the steps of:
   implanting oxygen into a (111) silicon substrate to define a (111) silicon surface layer on the (111) silicon substrate;
   converting at least a portion of the (111) silicon surface layer to 3C-silicon carbide;
   epitaxially growing a layer of 3C-silicon carbide on the converted (111) silicon surface layer;
   growing a buffer layer on the epitaxially grown layer of 3C-silicon carbide;
   growing a layer of 2H-gallium nitride on the buffer layer; and
   laterally growing the layer of 2H-gallium nitride to produce the gallium nitride microelectronic layer.

16. A method according to claim 15 wherein the converting step comprises the step of converting the entire (111) silicon surface layer to 3C-silicon carbide.

17. A method according to claim 15 wherein the step of converting comprises the step of chemically reacting the (111) silicon surface layer with a carbon containing precursor to convert at least a portion of the (111) silicon surface layer to 3C-silicon carbide.

18. A method according to claim 15 wherein the step of laterally growing comprises the steps of:
   forming a mask on the layer of 2H-gallium nitride, the mask including at least one opening that exposes the layer of 2H-gallium nitride; and
   laterally growing the layer of 2H-gallium nitride through the at least one opening and onto the mask.

19. A method according to claim 15 wherein the step of laterally growing comprises the steps of:
   forming at least one trench in the layer of 2H-gallium nitride that defines at least one sidewall in the layer of 2H-gallium nitride; and
   laterally growing the layer of 2H-gallium nitride from the at least one sidewall.

20. A method according to claim 15 wherein the step of laterally growing comprises the steps of:
   forming at least one post in the layer of 2H-gallium nitride that defines at least one sidewall in the layer of 2H-gallium nitride; and
   laterally growing the layer of 2H-gallium nitride from the at least one sidewall.

21. A method of fabricating a gallium nitride microelectronic layer comprising the steps of:
   epitaxially growing a layer of 3C-silicon carbide on a surface of a (111) silicon layer;
   growing a layer of 2H-gallium nitride on the epitaxially grown layer of 3C-silicon carbide; and
   laterally growing the layer of 2H-gallium nitride to produce the gallium nitride microelectronic layer.

22. A method according to claim 21 wherein the silicon layer is a (111) silicon substrate.

23. A method according to claim 21 wherein the step of epitaxially growing is preceded by the step of:
   implanting oxygen into a (111) silicon substrate to define the (111) layer on the (111) silicon substrate.

24. A method according to claim 21 wherein the step of growing is preceded by the step of growing an aluminum nitride and/or gallium nitride layer on the epitaxially grown layer of 3C-silicon carbide, and wherein the step of growing comprises the step of:
   growing a layer of 2H-gallium nitride on the aluminum nitride and/or gallium nitride layer, opposite the epitaxially grown layer of 3C-silicon carbide.

25. A method according to claim 21 wherein the step of laterally growing comprises the steps of:
   forming a mask on the layer of 2H-gallium nitride, the mask including at least one opening that exposes the layer of 2H-gallium nitride; and
   laterally growing the layer of 2H-gallium nitride through the at least one opening and onto the mask.

26. A method according to claim 21 wherein the step of laterally growing comprises the steps of:
   forming at least one trench in the layer of 2H-gallium nitride that defines at least one sidewall in the layer of 2H-gallium nitride; and
   laterally growing the layer of 2H-gallium nitride from the at least one sidewall.

* * * * *